United States Patent [19]

McGrath

[11] Patent Number: 5,502,747
[45] Date of Patent: Mar. 26, 1996

[54] METHOD AND APPARATUS FOR FILTERING AN ELECTRONIC ENVIRONMENT WITH IMPROVED ACCURACY AND EFFICIENCY AND SHORT FLOW-THROUGH DELAY

[75] Inventor: David S. McGrath, New South Wales, Australia

[73] Assignee: Lake DSP Pty Limited, Maroubra, Australia

[21] Appl. No.: 87,125

[22] Filed: Jul. 7, 1993

[30] Foreign Application Priority Data

Jul. 7, 1992 [AU] Australia ................................ PL3386
Jul. 7, 1992 [AU] Australia ................................ PL3387
Apr. 20, 1993 [AU] Australia ................................ PL8357

[51] Int. Cl.$^6$ ................................................ H04B 1/10
[52] U.S. Cl. ................... 375/350; 375/232; 364/724.19
[58] Field of Search ............................... 375/12, 14, 103; 364/714.19, 724.2, 725, 726, 728

[56] References Cited

U.S. PATENT DOCUMENTS

| | | | |
|---|---|---|---|
| 4,623,980 | 11/1986 | Vary . | |
| 4,821,289 | 4/1989 | Peile | 375/14 |
| 4,951,269 | 8/1990 | Amano et al. | 367/135 |
| 4,992,967 | 2/1991 | Auvray . | |
| 5,005,185 | 4/1991 | Mizoquchi et al. | 364/724.2 X |
| 5,159,565 | 10/1992 | Buné | 364/724.2 X |
| 5,224,123 | 6/1993 | Iga et al. | 375/14 |
| 5,315,621 | 5/1994 | Lucioni et al. | 375/103 |

FOREIGN PATENT DOCUMENTS

250048A1 12/1987 European Pat. Off. .
448758A1 10/1991 European Pat. Off. .
JP87/00833 10/1987 WIPO .

OTHER PUBLICATIONS

Agarwal, R. C. and Cooley, J. W., "Vectorized Mixed Radix Discrete Fourier Transform Algorithms", *Proceedings of the IEEE*, vol. 75, No. 9, (Sep. 1987) pp. 1283–1292.

Primary Examiner—Stephen Chin
Assistant Examiner—Bryan Webster
Attorney, Agent, or Firm—Fisher & Associates

[57] ABSTRACT

An improved method and apparatus for filtering an electronic environment with relatively high accuracy and efficiency and relatively short flow-through delay ("latency") is disclosed. Embodiments of the invention may be applied to digital filters implemented in software, hardware or a combination of both for applications such as audio filtering or electronic modelling of acoustic system characteristics. The method disclosed is broadly applicable in the field of signal processing and may be used to advantage, for example, in adaptive filtering; audio reverberation processing; adaptive echo cancellation; spatial processing; virtual reality audio; correlation, radar; radar pulse compression; deconvolution; seismic analysis; telecommunications; pattern recognition; robotics; 3D acoustic modelling; audio post production (including auralization and auto reverberant matching); audio equalization; compression; sonar; ultrasonics; secure communication systems; digital audio broadcast, acoustic analysis, surveillance; noise cancellation; and echo cancellation.

26 Claims, 18 Drawing Sheets

METHOD AND APPARATUS FOR FILTERING AN ELECTRONIC ENVIRONMENT WITH IMPROVED ACCURACY AND EFFICIENCY AND SHORT FLOW-THROUGH DELAY

FIELD OF THE INVENTION

The present invention relates to the art of electronic signal processing, and more particularly but not exclusively, to an electronic filtering environment wherein s relatively high accuracy and efficiency is desired and a relatively short flow-through delay (termed "latency") is desired.

DESCRIPTION OF THE PRIOR ART

With reference to FIG. 1, electronic filters are utilised to modify the characteristics of an incoming electronic signal so as to provide an output signal which is modified in some defined fashion. In the case of FIG. 1 a "notch" filter 1 is illustrated wherein, in the frequency domain, frequencies in the spectrum of the incoming signal S1 are attenuated in the $f_1$ to $f_2$ band so as to produce output signal S2.

Such filters can be implemented from entirely analog components although, in more recent times, there is a preference, in many circumstances, to implement the filter in a digital fashion. Digital implementation can be by means of dedicated digital circuitry or by means of computers (microprocessors) programmed to operate as a filter.

Filters have many applications in the field of electronic modelling of real world conditions. For example, filters can be used to provide a model of the acoustic characteristics of rooms or halls. Filters are also used to model deficiencies in systems so as to apply appropriate correction factors for the purpose of removing (cancelling) imperfections in signals caused by the deficiencies.

Frequently it is desirable that such processing take place in "real time". Also, it is desirable that there is effectively no delay in filtering of a signal generated in a real/live environment so that the modelling/correcting steps performed by the filter are, to all intents and purposes, without any delay being perceptible to the end user.

To achieve this the delay introduced by the filter 1 of FIG. 1 while it performs its filtering function must be reduced to a negligible figure. That is, the time when signal S1 is first presented to filter 1 and the time when the results of the filtering by filter 1 of the first incoming portion of signal S1 becomes available as signal S2 at the output of the filter 1 must be almost the same. The delay between these two events is hereinafter referred to as the "latency" of the filter system.

Where the filter 1 is implemented in a digital manner, it may first be necessary to sample the incoming signal S1 (via an analog to digital converter) then perform the filtering function and then convert the digital signal back to an analog signal (by means of a digital to analog converter). The sampling process takes samples of the incoming signal at discrete time intervals $t_i$. The time between each sample is usually the same.

The sampling processing itself introduces finite delays into the system. Additionally, where the filter is implemented by one of the popular fast convolution techniques there is a delay introduced which, in very broad terms, is proportional to the accuracy (or length) of the filter.

Mathematically, the filtering operation (that is, the step of imposing the filter characteristic upon the incoming signal S1 so as to produce outgoing signal S2) is known as "convolution" in the time domain. The step of convolution in the time domain becomes a multiply operation in the frequency domain. That is, if the incoming signal S1 is first sampled, then Fourier transformed into the frequency domain, the frequency response of the filter 1 is vector multiplied with the Fourier transform of the signal S1. The resulting signal is then inverse Fourier transformed to produce a sampled (convolved) output signal S2 (which can be converted back to analog form if required).

FIG. 2 shows the way a convolver 2 (also known as a Finite Impulse Response (FIR) filter) has its impulse response $\{a_k\}$ measured (for a convolver operating on a stream of sampled data). For a physical filter, $a_k$ is zero for all k<0. For a general input sequence $\{x_k\}$, the filter's output $\{y_k\}$ is defined as:

$$y_k = \sum_{i=0}^{\infty} a_i x_{k-i} \qquad (1)$$

For an input sequence $\{x_k\}$ where $x_k$ is equal to one (1) when k=0 and is equal to zero (0) otherwise (i.e., an impulse), the impulse response $\{a_k\}$ is obtained at the output $\{y_k\}$ of the filter 2. FIG. 3 illustrates such an input sequence $\{x_k\}$ and the corresponding output sequence $\{y_k\}$ which is equal to the impulse response $\{a_k\}$.

A linear filter such as this filter 2 has a measurable latency, d, shown in FIG. 3 defined as:

$$a_d \neq 0, \text{ and}$$

$$a_k = 0 \text{ for all } k < d \qquad (2)$$

In other words, $a_d$ is the first non-zero value in the output sequence. The latency d is never negative in a physical system. In a similar fashion, for a Finite Impulse Response Filter, we can determine which is the LAST non-zero value in the output sequence. This will give us the length of the impulse response. If we call the length 1, then this means that $a_{d+1-1}$ is the last non-zero value in the output sequence (see FIG. 3).

Typical schemes for implementing FIR filters fall into two categories:

1. Time domain filters that compute each output sample as each new input sample arrives, thus allowing latencies as low as d=0 or d=1. Typical filter lengths (1) are short.
2. Fast convolution filters that compute a number of output samples in a block. Typical filter lengths (1) can be very long. The lowest achievable latency is usually related to the filter length, d≈1÷K or $$K \approx 1'd \qquad (3)$$

where K is a measure of the efficiency of the particular algorithm used. A typical value of K, for the commonly used fast convolution algorithms such as illustrated in FIGS. 4 and 5, is 0.5.

A first fast convolution system shown in FIG. 4 processes the input data $x_k$ in blocks using two parallel paths. The input data sequence $x_k$ is processed in time segments a–g, and correspondingly the output data $y_k$ is also produced in blocks. Each time segment contains M samples. In a first parallel path, a Fast Fourier Transform (FFT) block 5 receives an input data $(x_k)$ block 3, which comprises the data of the time segments a and b, and produces frequency domain input data X(f) represented by a block 7. The frequency domain input data 7 and a filter vector 9 are provided to a multiplier 11 which produces frequency domain output data Y(f) represented by a block 13. An inverse FFT block 15 then performs an inverse FFT operation on the frequency domain output data 13 to produce an output data ($y_k$) block 17.

The second path similarly includes an FFT block 6, frequency domain input data X(f) represented by a block 8, a filter vector 10, a multiplier 12, frequency domain output data Y(f) represented by a block 13, and an inverse FFT block 16. An output data ($y_k$) block 18 is produced by the second path from input data ($x_k$) block 4, which comprises the data of the time segments b and c.

A second fast convolution system shown in FIG. 5 processes the input data $x_k$ in a block 19 comprising 2L samples. A Fast Fourier Transform (FFT) block 20 receives input data block 19 to produce frequency domain input data X(f) at its output. The frequency domain input data X(f) and filter vector 22 are provided to multiplier 21 which produces frequency domain output data Y(f). Inverse FFT block 23 then performs an inverse FFT operation on the frequency domain output data Y(f) and provides its output to block 24. Block 24 discards half of the output vector (i.e., L components of the output sequence) to provide output block 25 of length L which is the output sequence $y_k$.

BRIEF DESCRIPTION OF THE INVENTION

It is an object of at least a preferred embodiment of the present invention to provide a method and apparatus for performing relatively long convolutions on digital sampled data so as to provide relatively higher efficiency for a given length than is ordinarily produced with other methods.

In this specification it is assumed that the filter characteristics can be modelled as approximately linear so that the principles of superposition can be applied.

Accordingly, in one broad form of the invention there is provided a filter with a long impulse response and low latency, built by operating a number of smaller component filters in parallel and combining their outputs by addition, with each component filter operating with a different delay such that the net operation of the ensemble or said component filters is the same as a single filter with a longer impulse response, and the latency of the ensemble is equal to the shortest latency of the said component filters.

Preferably the component filters are implemented in different ways, with some filters adapted to provide low latency, and other filters adapted to provide longer filter lengths, such that the ensemble filter provides both low latency and long impulse response characteristics.

Preferably one or more of the component filters is implemented as a time-domain finite impulse response filter (built with multiply and add operations) and the remainder are implemented using a fast convolution method, such that the time-domain filter(s) provides the lowest latency portion of the ensemble impulse response, and the fast-convolution filter(s) provide the longer filter components.

Preferably the fast-convolution filters are built using the Discrete Fourier Transform or the Fast Fourier Transform.

In an alternative preferred form the fast-convolution filters are built using the Modified Discrete Fourier Transform as described in this specification.

Preferably a group or groups of more than one of the component filters are implemented using fast convolution techniques with the component filters in each group using a transform of the same length, and wherein only one transform operation is performed for each group, so that the component filters in each group share the transformed output from the respective transform operation.

In an alternative preferred form a group or groups of more than one of the component filters are implemented using fast convolution techniques with the component filters in each group using a transform of the same length, and wherein only one inverse transform operation is performed for each group, so that the output from the component filters in each group is summed before being passed to the respective inverse transform operation.

In a further alternative preferred form a group or groups of more than one of the component filters are implemented using fast convolution techniques with the component filters in each group using a transform of the same length, and wherein only one transform operation is performed for each group, so that the component filters in each group share the transformed output from the respective transform operation; and wherein a group or groups of more than one of the component filters are implemented using fast convolution techniques with the component filters in each group using a transform of the same length, and wherein only one inverse transform operation is performed for each group, so that the output from the component filters in each group is summed before being passed to the respective inverse transform operation.

In a further broad form of the invention there is provided a method for building a digital filter with a long impulse response and low latency, built by operating a number of smaller component filters in parallel and combining their outputs by addition, with each component filter operating with a different delay such that the net operation of the ensemble of said component filters is the same as a single filter with a longer impulse response, and the latency of the ensemble is equal to the shortest latency of the said component filters.

Preferably the component filters are implemented in different ways, with some filters adapted to provide low latency, and other filters adapted to provide longer filter lengths, such that the ensemble filter provides both low latency and long impulse response characteristics.

Preferably one or more of the component filters is implemented as a time-domain finite impulse response filter (built with multiply and add operations) and the remainder are implemented using a fast convolution method, such that the time-domain filter(s) provides the lowest latency portion of the ensemble impulse response, and the fast-convolution filter(s) provide the longer filter components. Preferably the fast-convolution filters are built using the Discrete Fourier Transform or the Fast Fourier Transform.

Preferably the fast-convolution filters are built using the Modified Discrete Fourier Transform as described in this specification.

Preferably a group or groups of more than one of the component filters are implemented using fast convolution techniques with the component filters in each group using a transform of the same length, and wherein only one transform operation is performed for each group, so that the component filters in each group share the transformed output from the respective transform operation.

In an alternative preferred form a group or groups of more than one of the component filters are implemented using fast convolution techniques with the component filters in each group using a transform of the same length, and wherein only one inverse transform operation is performed for each group, so that the output from the component filters in each group is summed before being passed to the respective inverse transform operation.

In a further alternative preferred form a group or groups of more than one of the component filters are implemented using fast convolution techniques with the component filters in each group using a transform of the same length, and wherein only one transform operation is performed for each group, so that the component filters in each group share the transformed output from the respective transform operation; wherein a group or groups of more than one of the component filters are implemented using fast convolution techniques with the component filters in each group using a transform of the same length, and wherein only one inverse transform operation is performed for each group, so that the output from the component filters in each group is summed before being passed to the respective inverse transform operation.

In yet a further broad form of the invention there is provided a digital filter for filtering overlapped groupings of consecutive samples a, b, c, d, ..., said filter comprising a transform processor of length m, and N filter processors, each of length k, an adder adapted to sum the outputs as they are fed in parallel from said N filter processors, an inverse transform processor of length m; said consecutive samples a, b, c, d, ..., being fed in blocks of length m, each of said blocks being passed through said transform processor and then through each of said N filter processors with a delay of zero before being passed through a first filter processor of said N filter processors, a delay of k before being passed through a second filter processor and so on up to a delay of (N−1) k before being passed through the Nth filter processor; whereby a filter of effective length Nk is effected with a latency corresponding to that of a conventional filter of length k.

In a further broad form of the invention there is provided a method of implementing a filter with a relatively high length/latency efficiency K; said method comprising transforming progressive, consecutive and overlapping portions of input data into the frequency domain, to produce corresponding transformed data, storing said corresponding transformed data, so as to effect passing said portions of transformed data through a transform processor consecutively; feeding a first transformed portion through a first filter function processor; then feeding said first transformed portion through an N−1th filter function processor whilst an N−1th transformed portion is being fed through said first filter function processor; and so on so that a continuously moving N consecutive blocks of input data are transformed and passed through N filter function processors; adding the output from said N filter function processors; inverse transforming said output; performing a discard operation as necessary whereby consecutive portions of filtered output data are produced from said progressive, consecutive and overlapping portions of input data.

In a further broad form of the invention there is provided a method of implementing a filter with a relatively high length/latency efficiency K; said method comprising applying a mathematical transform to progressive, consecutive and overlapping portions of input data so as to produce corresponding transformed data; performing a mathematical operation on individual ones (i.e. two or more) of said transformed data; superposing (by addition) the data resulting from said mathematical operations so as to produce resultant data; applying an inverse mathematical transform to said resultant data so as to produce filtered output data.

Preferably each said filter function processor is processing a filter whose Impulse Response is half the length of the transform processor. Preferably said transform processor is a Fast Fourier Transform Processor and said inverse transform processor is an inverse Fast Fourier Transform Processor and said filter function processor is effected by a multiply operation of transformed input data with an impulse response corresponding to a selected portion of a desired impulse response for the entire filter.

Preferably said method is optimized whereby an approximately equal amount of processing time is spent on Fourier transformation as on filter function (multiply) operation.

In a further broad form of the invention there is provided a method of implementing a filter with a relatively high length/latency efficiency K; said method comprising transforming progressive, consecutive and overlapping portions of input data into the frequency domain, performing a mathematical operation on individual ones of said transformed signals, superposing (by addition) the consecutive signals resulting from said mathematical operations, inverse transforming the resultant signal from the frequency domain back to the time domain and outputting said signal.

Preferably said transform is a Fast Fourier Transform and said inverse transform is an Inverse Fast Fourier Transform.

Preferably said mathematical operation is a vector multiply of the Fourier transformed input signal segment with the frequency response of the desired (time domain) filter characteristic.

Preferably the underlying operation is an overlap and discard operation on successive, overlapping portions of input data. Alternately the underlying operation is an overlap and add operation on successive, overlapping portions of input dated. In a particular preferred form the Fourier transform of any given overlapping block of input samples is taken only once and reused as required. Preferably, the inverse Fourier transform of any given summed grouping of filtered data is performed only once.

In a particular preferred form the above described method is utilised to implement at least some of the filter modules of a composite electrical filter; said composite electrical filter comprising a plurality of filter modules arranged to receive in parallel an incoming input signal for filtering; the output from each of said filter modules being summed to produce a composite filtered output signal; each of said filter modules adapted to have an impulse response that is a selected portion of the impulse response of the composite filter. It is preferable to minimise the overlap of the selected portions of impulse response, or to make them not overlap at all.

Preferably the length of each of said filter modules is different with the characteristic of the shorter length filter modules adapted to process first (or earlier) portions of said impulse response and longer length filter modules adapted to process following (or later) portions of said impulse response.

Preferably said longer length filter modules are adapted to filter progressively longer portions of said impulse response.

In a particular preferred form, the shortest module of said plurality of filter modules is a time-domain (low latency) filter whilst additional ones of said filter modules are longer fast-convolution (longer latency) filters implemented using the Fast Fourier Transform method described above or other traditional fast convolution methods.

It is an object of at least a further preferred embodiment of the present invention to provide a method and apparatus for performing relatively long convolutions on digital sampled data so as to provide relatively lower latency than is ordinarily incurred with other methods.

It is assumed that the filter characteristics can be modelled as approximately linear so that the principles of superposition can be applied.

Accordingly, in yet a further broad form of the invention, there is provided a composite electrical filter comprising a plurality of filter modules arranged to receive in parallel an incoming input signal for filtering; the output from each of said filter modules being summed to produce a composite filtered output signal; each of said filter modules adapted to have an impulse response that is a selected portion of the impulse response of the composite filter.

It is preferable to minimise the overlap of the selected portions of impulse response, or to make them not overlap at all.

Preferably the length of each of said filter modules is different with the characteristic of the shorter length filter modules adapted to process first (or earlier) portions of said impulse response and longer length filter modules adapted to process following (or later) portions of said impulse response.

Preferably said longer length filter modules are adapted to filter progressively longer portions of said impulse response.

In a particular preferred form, the shortest module of said plurality of filter modules is a time-domain (low latency) filter whilst additional ones of said filter modules are longer fast-convolution (longer latency) filters.

Preferably only the shortest of said filter modules is a time domain filter.

In a further particular preferred form, where the number of said filter modules is N comprising filters $F_1, F_2 \ldots F_N$ filter module $F_1$ is a filter with very low latency implemented with time domain techniques whilst all other filter modules $F_i$ are implemented with fast convolution techniques and these fast convolution filters $F_i$ are composed of a sequence of filters each with longer filter length than its predecessor and hence each with longer latency, but still preserving the property that $d_{i+1}=d_i+l_i$ whereby it is ensured that the composite filter F output formed by summing together the N component filter outputs has an impulse response without any "holes" in it.

In a further broad form of the invention there is provided a method of filtering sampled data so as to achieve a relatively long length but short latency filtering of said data, said method comprising passing said data in parallel through a plurality of sub-filters and summing the output samples from all of said sub-filters to produce filtered sampled data; and wherein the Impulse Response of each of said sub-filters is a selected portion of the desired Impulse Response of the filter characteristic required to produce said filtered sampled data from said sampled data and wherein each said selected portion is selected for each of said sub-filters such that the output from all of said sub-filters, when summed, behaves as if filtered through a filter having said desired Impulse Response.

In a particular implementation of the invention, there is provided a method and filter incorporating a fourier transform processor adapted to efficiently transform strings of real numbers; said processor operating according to the following method:

1. Take the input vector x(k) of length N, where each element of x(k) is real.
2. Create the vector x'(1), a complex vector of length N/2 by application of the following:

$$x'(l) = \left[ x(l) - jx\left(l+\frac{N}{2}\right) \right] e^{\frac{-\pi jl}{N}} \text{ for } 0 \leq 1 \leq N/2.$$

3. Compute the N/2 point DFT of x(1) to give the N/2 complex result vector Z(p).

$$Z(p)=DFT_{(N/2)}[x'(1)].$$

Embodiments of the invention will now be described with reference to the accompanying drawings wherein:

DETAILED DESCRIPTION OF PREFERRED EMBODIMENTS OF THE INVENTION

1. High Efficiency Filter

Figure 1:
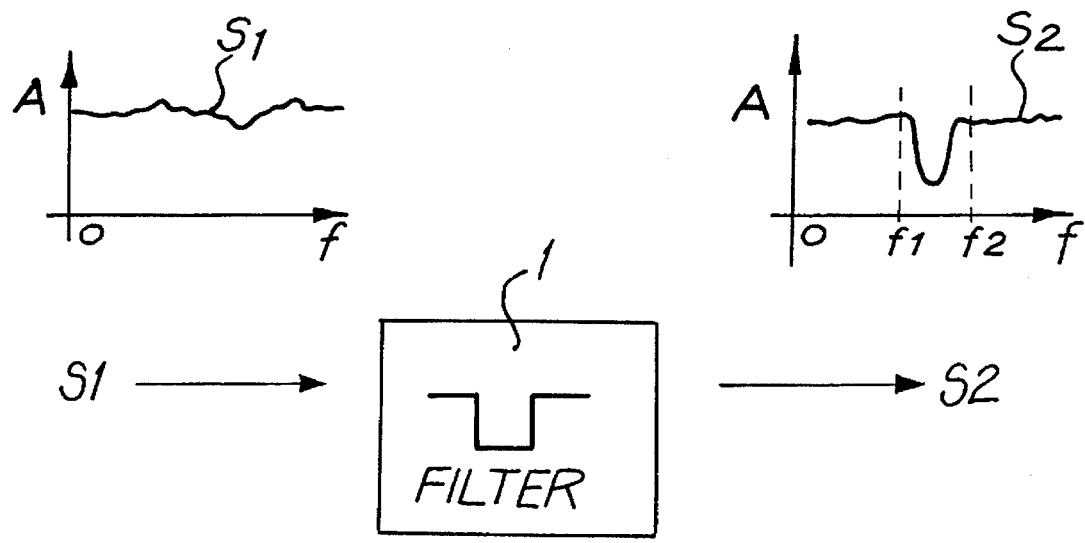
FIG. 1 is a generalised block diagram of a filter operation in the frequency domain.
Figure 2:
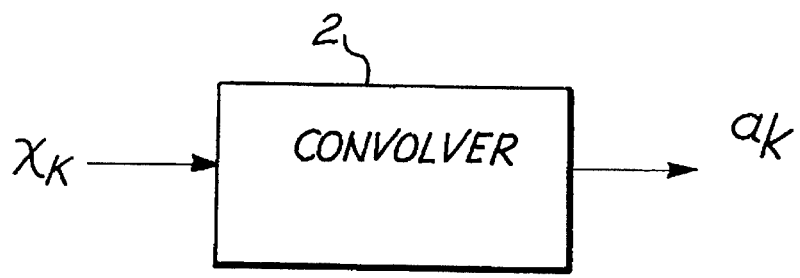
FIG. 2 defines the basic terminology used for a convolution filter.
Figure 3:
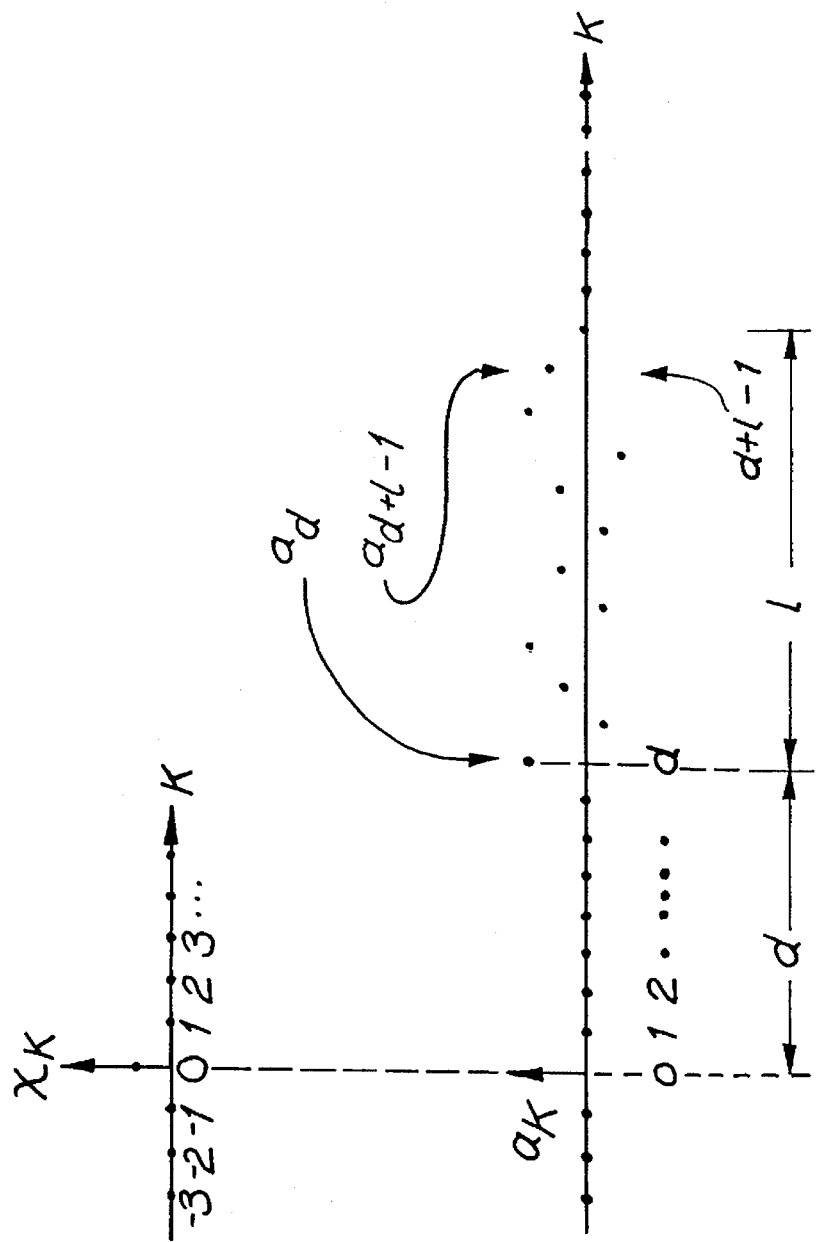
FIG. 3 defines the latency and length of the filter of FIG. 2.
Figure 4:
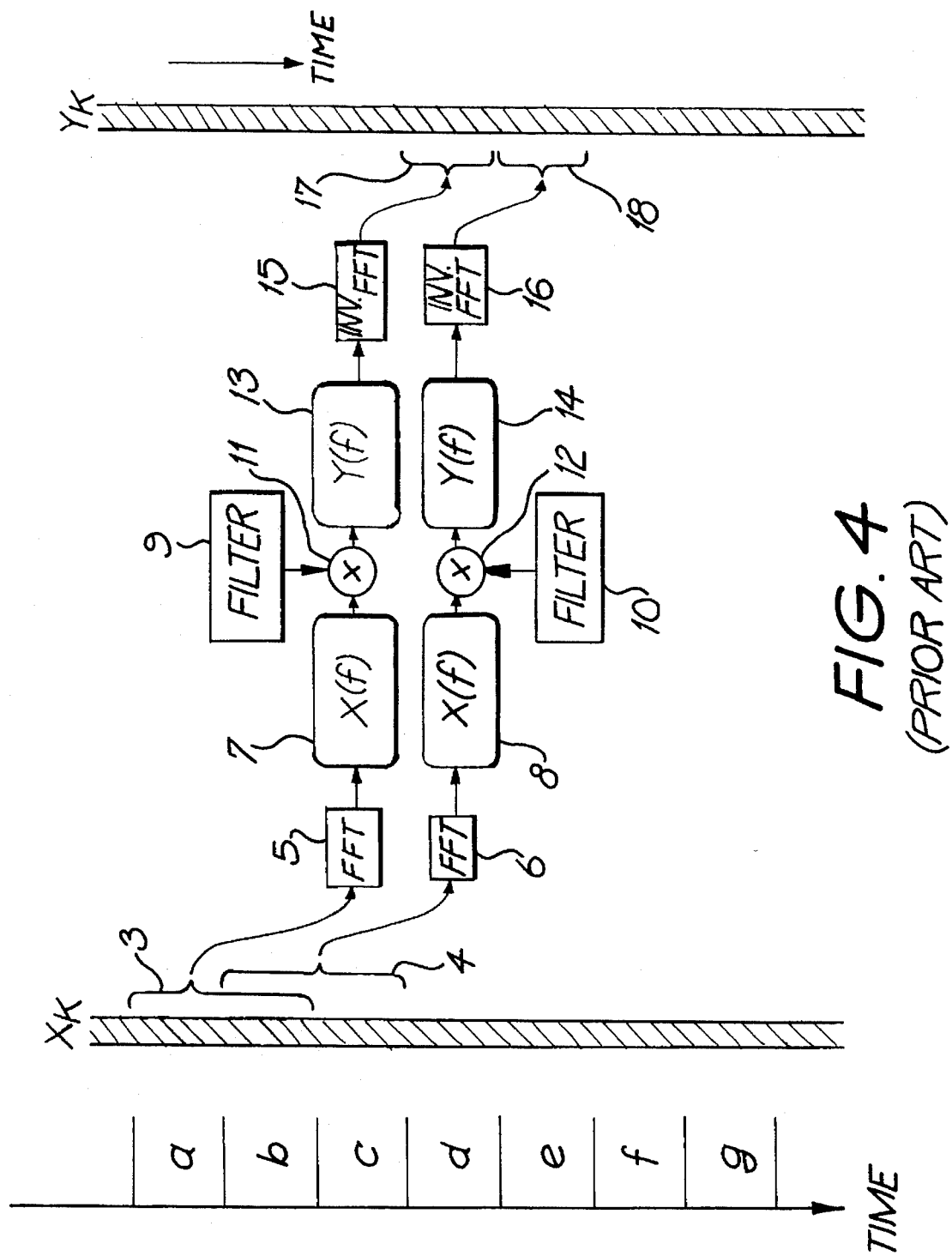
FIG. 4 illustrates in a diagrammatic flow chart form, a prior art method of processing sampled data by a Fast Fourier Transform approach.

FIG. 4 illustrates the time-flow of a typical fast convolution algorithm. This is an overlap-discard algorithm implemented using the Fast Fourier Transform (FFT blocks 5 and 6). 2M words of input data that arrives during time segments a and b is processed fully during time segment c with a forward FFT (blocks 5 and 6), a vector multiply (blocks 11 and 12), and an inverse FFT (blocks 15 and 16). The resulting M words of output data (17 and 18) are buffered, to be presented at the output during time segment d. The FFT and inverse FFT (IFFT) (blocks 5 and 6 and blocks 15 and 16, respectively) are only used to transform the data between the time-domain and frequency domain. The actual filter operation is executed in the vector multiply operation, which actually takes only a small fraction of the total compute time. So, the relevant parameters of the filter of FIG. 4 are:

Length=M,

Latency=2M, and, therefore K=0.5

Figure 6:
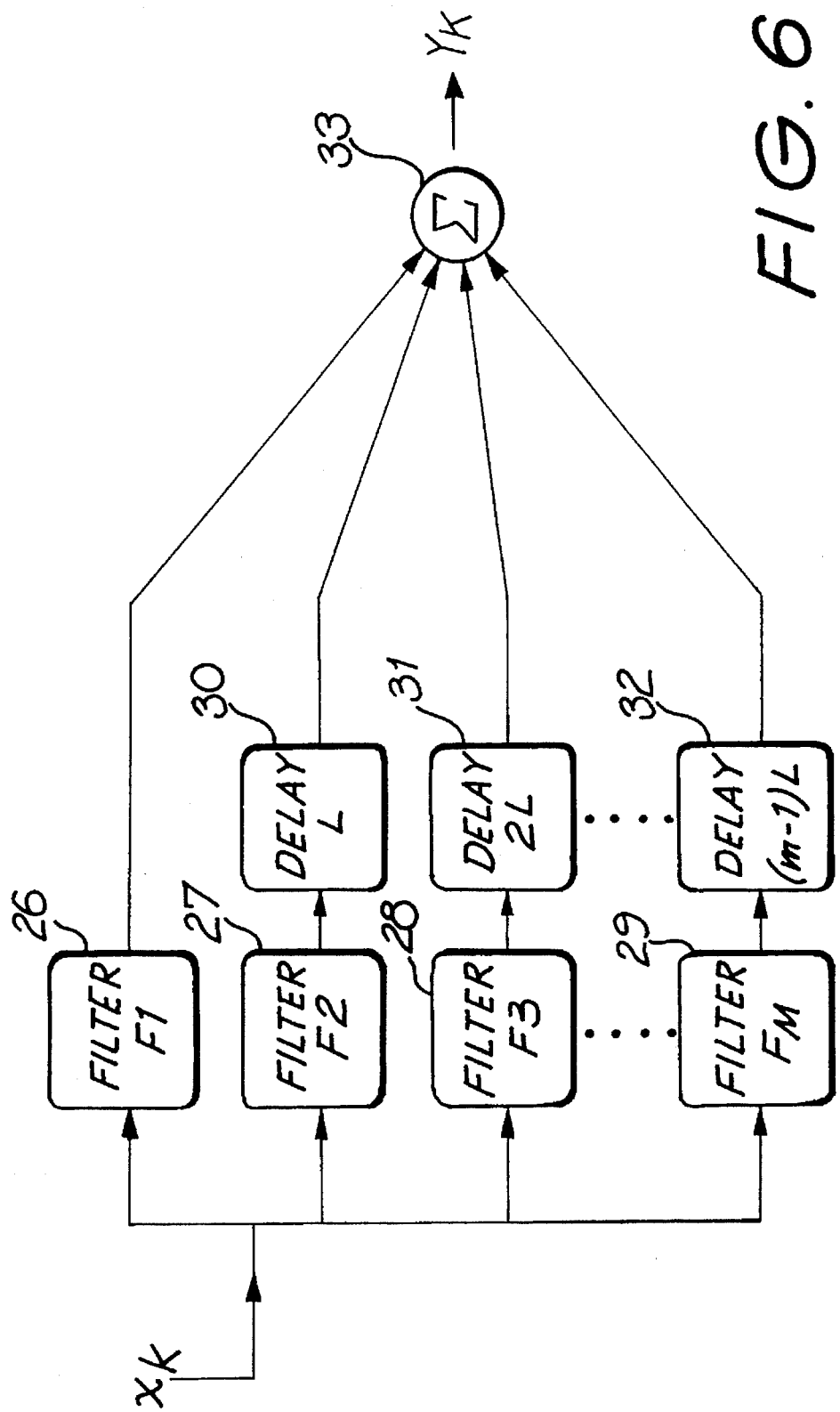
FIGS. 6,7,8 develop a method of filtering according to a generalised first embodiment of the invention whereby a relatively high efficiency factor K can be achieved as compared with the approach of FIG. 4.
Figure 7:
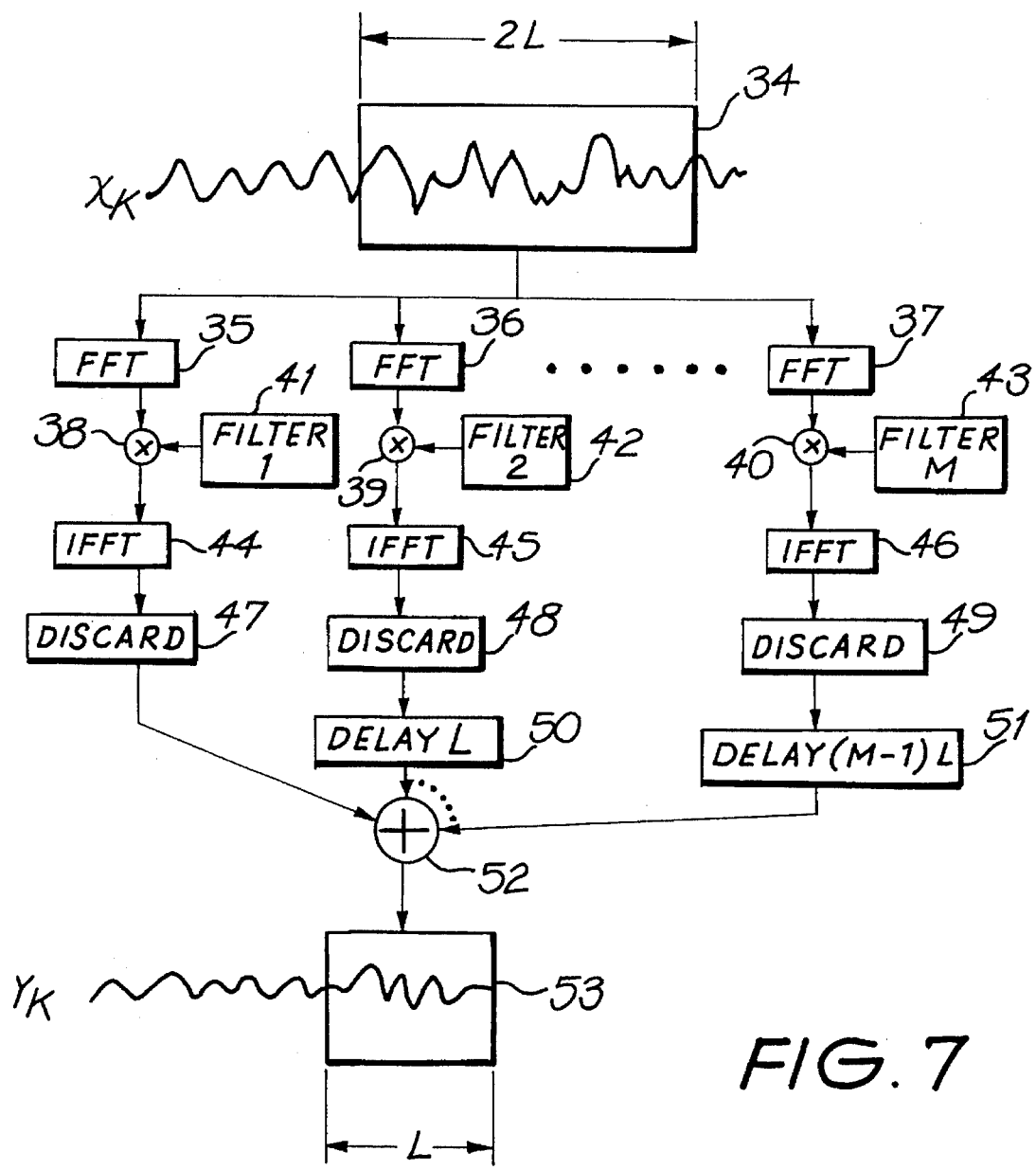
Figure 8:
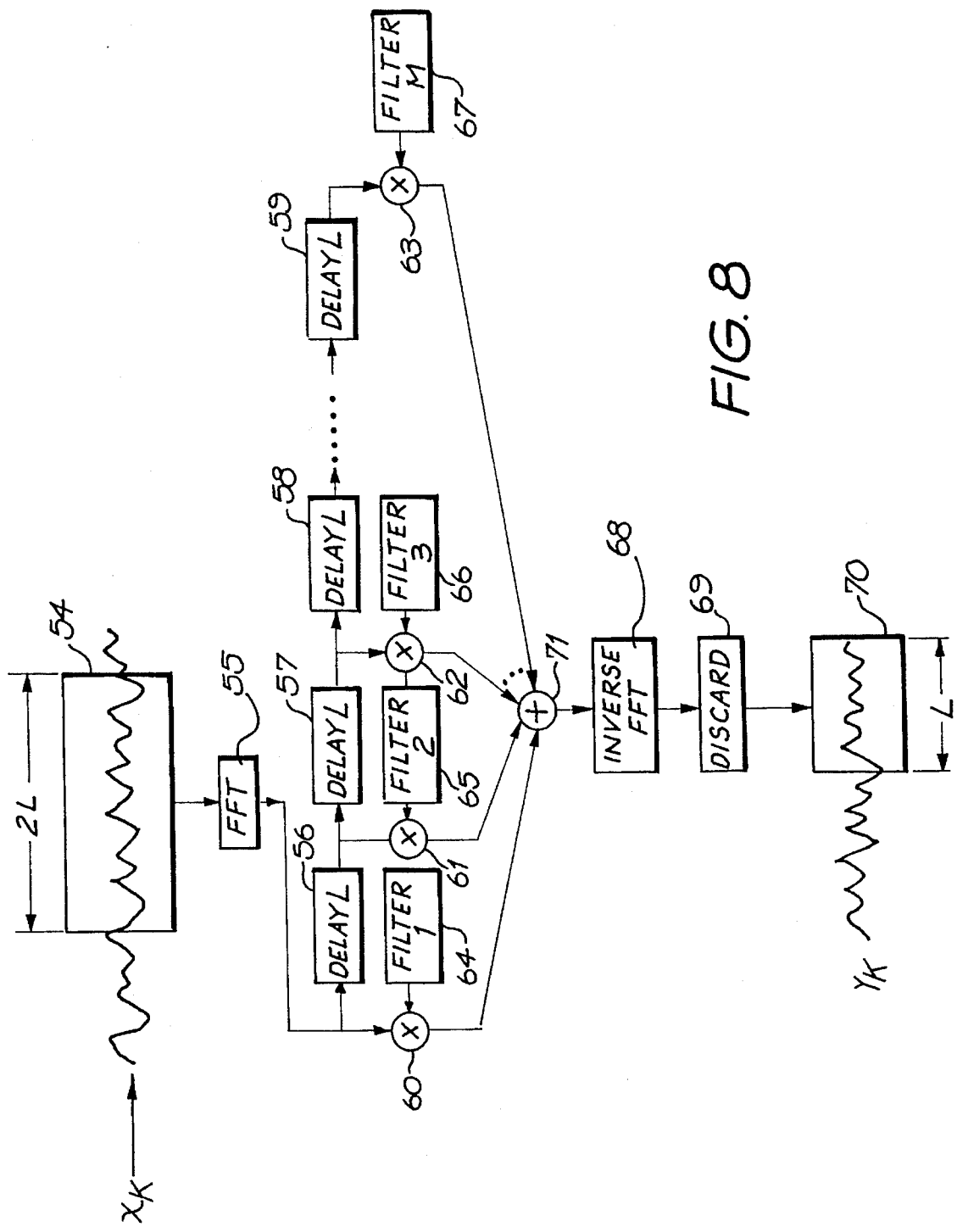

With reference to FIGS. 6, 7 and 8, the rationale behind the method and apparatus according to at least one embodiment of the present invention is derived.

FIG. 6 illustrates a filtering system according to a generalised first embodiment of the invention whereby a relatively high efficiency factor K can be achieved. In this system, the input sequence $x_k$ is provided to filter blocks 26–29, which are filters F1–FM, respectively. The outputs of the filter (F2–FM) blocks 27–29 are coupled to delay blocks 30–32 having delay lengths of L, 2 L, ..., (M–1)L, respectively. The outputs of the filter (F1) block 26 and the delay blocks 30–32 are provided to a summation block 33 which produces the output sequence $y_k$.

FIG. 6 illustrates a filter of length ML where the filter characteristics of each of the component filters $F_1, F_2, \ldots F_n$ are separate, discrete, component portions (blocks 26–29) of the desired filter characteristic for the entire filter assembly. The delay blocks 30–32 of delay length L, 2 L ... (M–1) L are imposed as illustrated so as to recreate, following addition (performed by summation block 33), an output $y_k$ equivalent to that achieved by passing input samples $x_k$ through a filter having the filter characteristic from which the filter characteristic portions for filters F1, F2 ... were derived.

Figure 5:
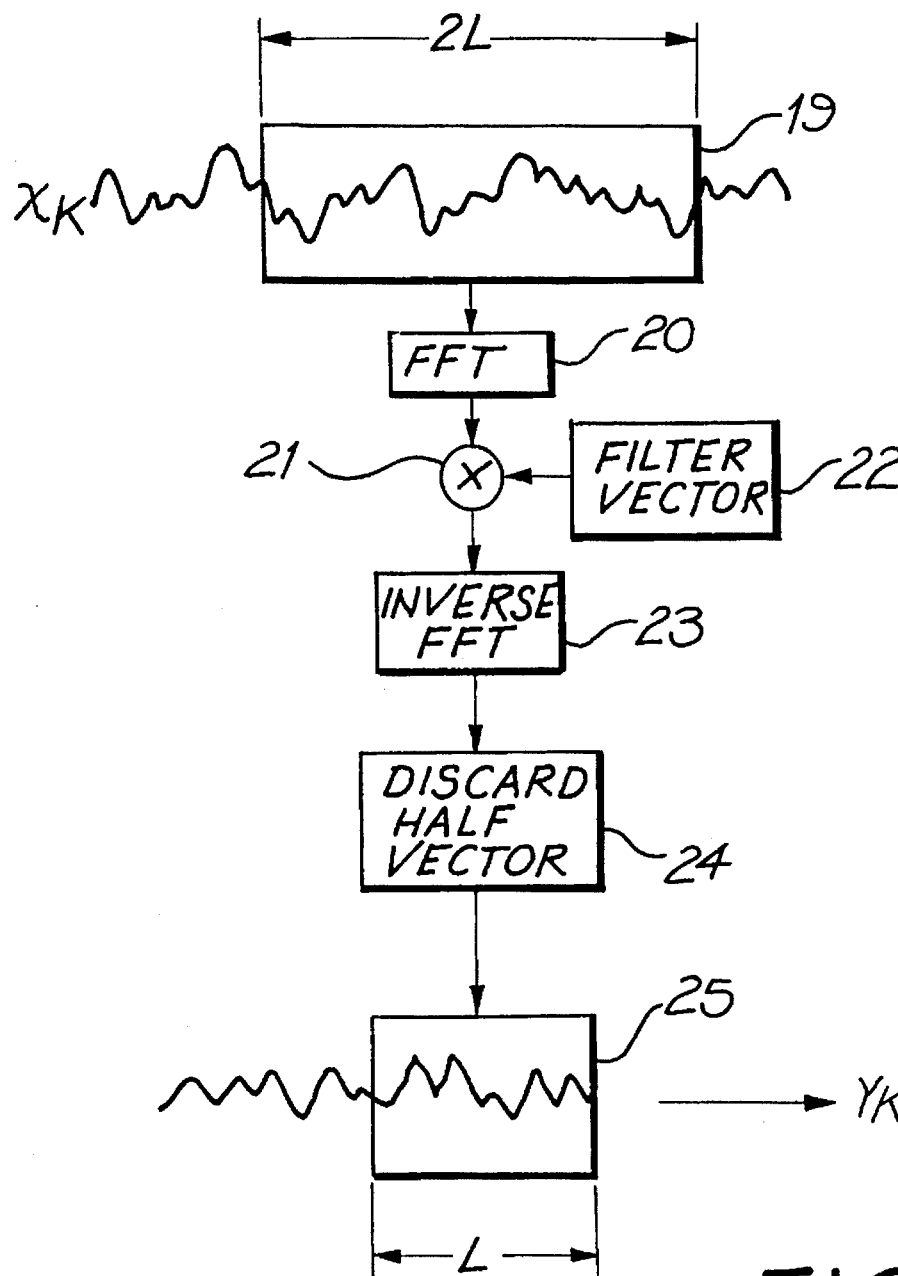
FIG. 5 further illustrates the approach of FIG. 4.

FIG. 7 is derived by implementing the filters F1, F2 ... of FIG. 6 using the Fast Fourier Transform algorithm of FIG. 5. A block 34 of 2 L samples of the input is sequence $x_k$ is provided to FFT blocks 35–37. The outputs of the FFT blocks 35–37 and filter vectors (filters 1–M) 41–43 are provided to multipliers 38–40, respectively. The frequency domain output data produced by the multipliers 38–40 are provided to IFFT blocks 44–46, respectively. The time domain output data produced by the IFFT blocks 44–46 are provided to discard blocks 47–49 which discard L samples of the respective output data. The outputs of the discard blocks 48 and 49 are coupled to delay blocks 50 and 51 having delay lengths of L to (M–1)L, respectively. The outputs of the discard block 47 and the delay blocks 50 and 51 are provided to a summation block 52 which produces a block 53 comprising L samples of the output sequence $y_k$.

In FIG. 8, a block 54 of 2 L samples of the input sequence $x_k$ is provided to a single FFT block 55. The output of the FFT block 55 is provided to a multiplier 60 and a delay block 56 of delay length L. Delay blocks 56–59, each of delay length L, are coupled to each other in series. Furthermore, the outputs of the delay blocks 56–59 are provided to multipliers 61–63, respectively. Filter vectors 64–67 are also coupled to the multipliers 60–63, respectively. The outputs of multipliers 60–63 are coupled to a summation block 71. The frequency domain output data produced by the summation block 71 is provided to an IFFT block 68. A discard block 69 discards L samples of the output provided by the IFFT block 68 to produce a block 70 of L samples of the output sequence $y_k$.

With reference to FIG. 8, reorganisation of the filter of FIG. 7 allows the use of only one Fast Fourier Transform module 55 and one inverse Fast Fourier Transform module 68. It is implicit that the Fast Fourier Transform module 55 is adapted to process a block of samples from input $x_k$ equal to twice the length of each of the filters 1–M of filter blocks 64–67 illustrated in FIG. 8.

As previously stated the filter characteristic (impulse response) of each consecutive filter F1, F2 ... is taken from and corresponds to consecutive corresponding portions from the impulse response desired of the entire filter module.

The time delay L (provided by the delay blocks 56–59) before each Fast Fourier transformed block of data is passed through the next filter is equal to L, which is half of the sample length 2 L originally processed by the Fast Fourier Transform module 55.

Figure 9:
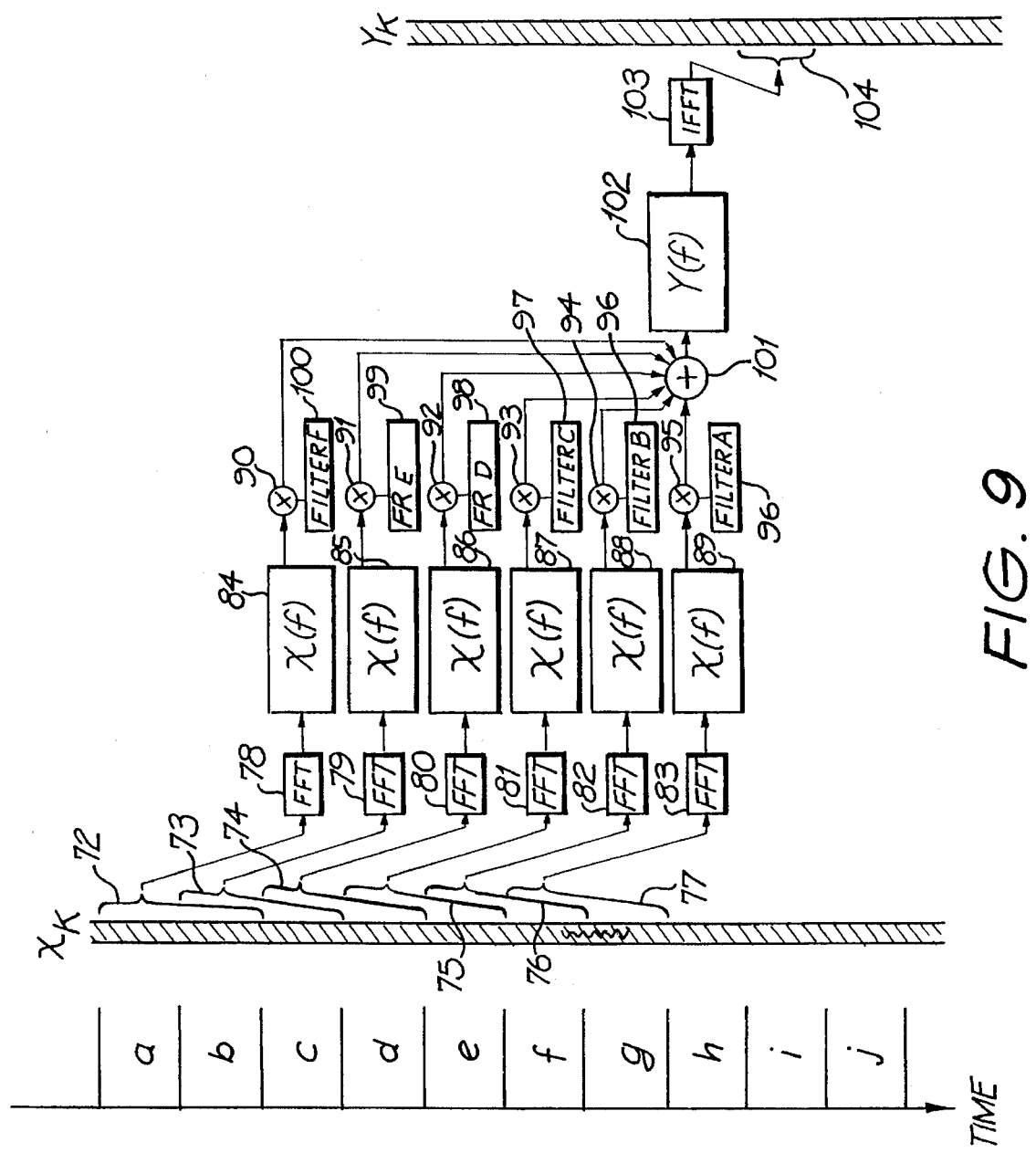
FIG. 9 is a diagram of an embodiment of the invention implementing the method of FIG. 8 where the number of sub-filters is 6.

FIG. 9 shows the computation of one block of output data, in a similar style to FIG. 4, but using the improved length/latency efficiency method derived in FIGS. 6, 7 and 8. The input data $x_k$ is processed in blocks 72–77 using a number of parallel paths (in this example, six parallel paths). For instance, the input data block 72 includes the time segments a and b, and the input data block 77 comprises the time segments f and g. Each of the time segment a–j contains M samples.

The input data blocks 72–77 are provided to Fast Fourier Transform (FFT) blocks 78–83 which produces frequency domain input data (X(f)) 84–89, respectively. The frequency domain input data 84–89 are provided to multipliers 90–95, respectively. In addition, filter vectors (filters A–F) 96–100 are also provided to the multipliers 95–90, respectively. The output of the multipliers 90–95 are coupled to summation block 101 which produces the frequency domain output data Y(f) represented by block 102. An IFFT block 103 then performs an inverse FFT operation on the frequency domain output data 102 to produce an output data ($y_k$) block 104. The method of FIG. 8 as used by FIG. 9 is summarised below.

For example, during the time segment h, the input data $x_k$ that arrived during time segments f and g (constituting the input data block 77) is FFT'd by the FFT block 83 and the resulting block 89 of Frequency Domain Input Data (X(F)) is stored for future use. We then compute the next block 102 of Frequency Domain Output Data (Y(f)), which is inverse FFT'd by the IFFT block 103 and presented as the block 104 of the output sequence $y_k$ during time segment i. The old way of computing fast-convolution simply took the latest block of Frequency Domain Input Data, and multiplied it by a vector that represents the desired filter response, to get the new Frequency Domain Output Data. The improved length/latency efficiency method uses a number of previous Frequency Domain Input Data blocks 84–89 to compute the new Frequency Domain Output Data block 102, as shown in FIG. 9. In this example, the blocks 96–100 of filter data are called Filter A, Filter B, ..., Filter F. In this example, the filter implemented is 6 times as long as the filter implemented in FIG. 4, but with no greater latency. By comparison with FIG. 4, the relevant parameters of the filter of FIG. 9 are:

Length=6M,

Latency=2M, and, therefore K=3

FIG. 8 summarises the logic behind the implementation of the embodiment of FIG. 9.

Particularly, it will be noted that the progressive delays L, 2 L, 3 L, . . . (M−1)L of FIG. 8 provided by delay blocks 58–59 are achieved in FIG. 9 by the taking of delayed, overlapped groupings of consecutive samples, i.e. time segments a, b, c, d, . . .

Figure 10:
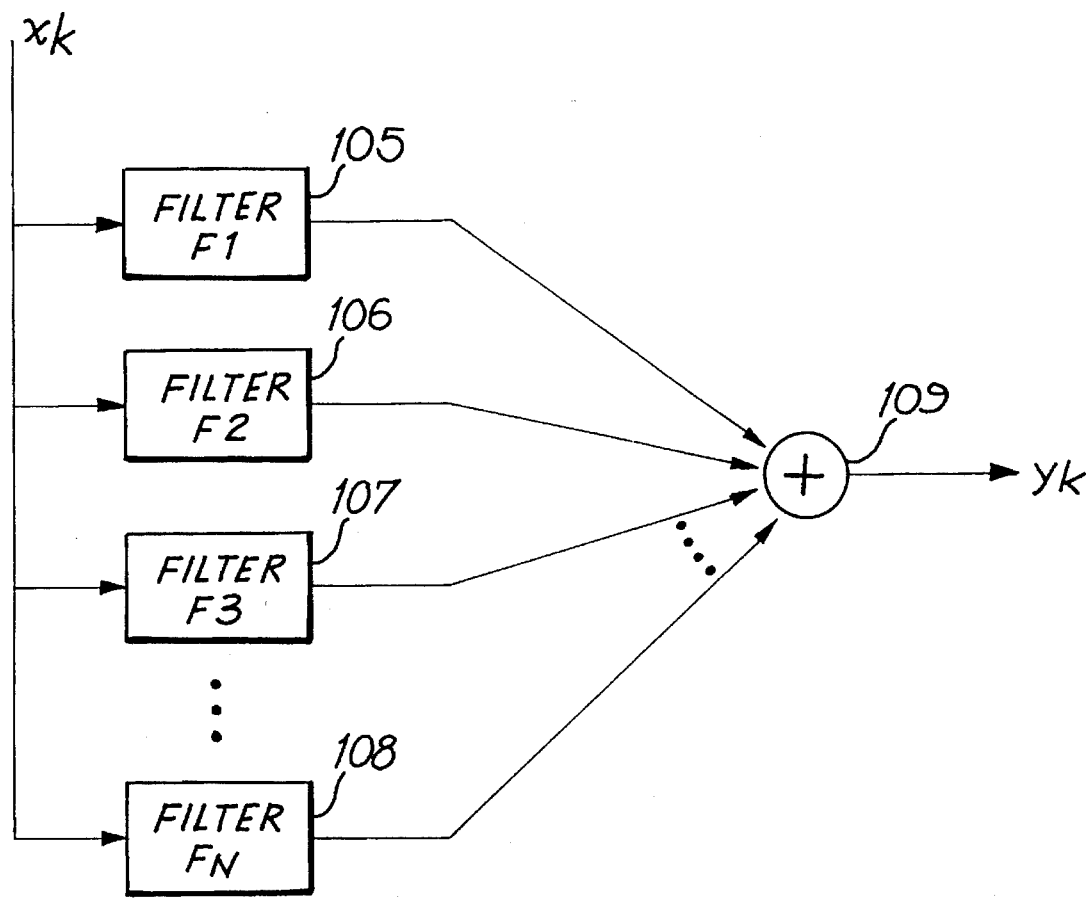
FIG. 10 illustrates in block diagram form a summed filter a part of which can be implemented advantageously with the filter of FIG. 8.

The above described filter arrangement can be used advantageously in a low-latency FIR filter arrangement such as illustrated in FIG. 10. The input sequence $x_k$ is provided to filter blocks 105–108 (i.e., filters F1–FN). The outputs of the filter blocks 105–108 are provided to a summation block 109 which produces the output sequence $y_k$.

FIG. 10 shows an architecture for implementing an FIR filter by adding together N filters (filter blocks 105–108). If each filter is characterised as: Filter $F_i$, latency $d_i$, length $1_i$, then generally the N filters are chosen so that their latencies are ordered in ascending order, and furthermore $d_{i+1}=d_i+1_i$. This means that the first non-zero value in the impulse response of filter $F_{i+1}$, comes immediately following the last non-zero value in the impulse response of filter $F_i$. Hence this summation of filters results in a single, longer filter with its impulse response being the sum of the impulse responses of the N component filters (filter blocks 105–108).

The important property or this filter is the length/latency efficiency, K, which is higher than any of the component filter efficiencies.

That is, the filter of FIG. 10 uses the technique of adding together several filters to form a new filter which is as long as the sum of the component filter lengths, and whose latency is as short as the latency of the lowest-latency component filter.

Figure 11A:
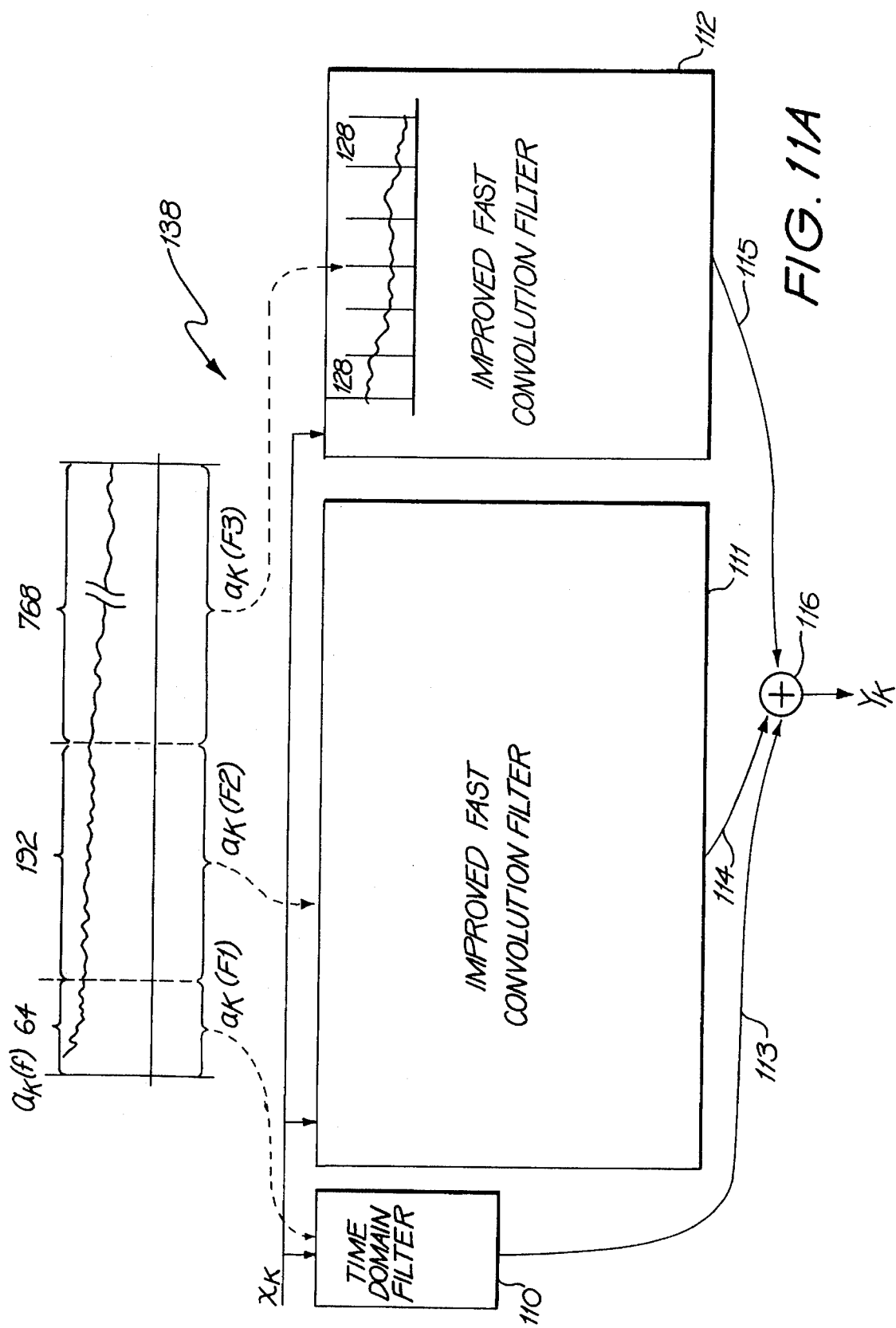
FIGS. 11A&11B are block diagrams of the summed filter of FIG. 10 incorporating sub-filters some of which implement the method or FIG. 8.
Figure 11B:
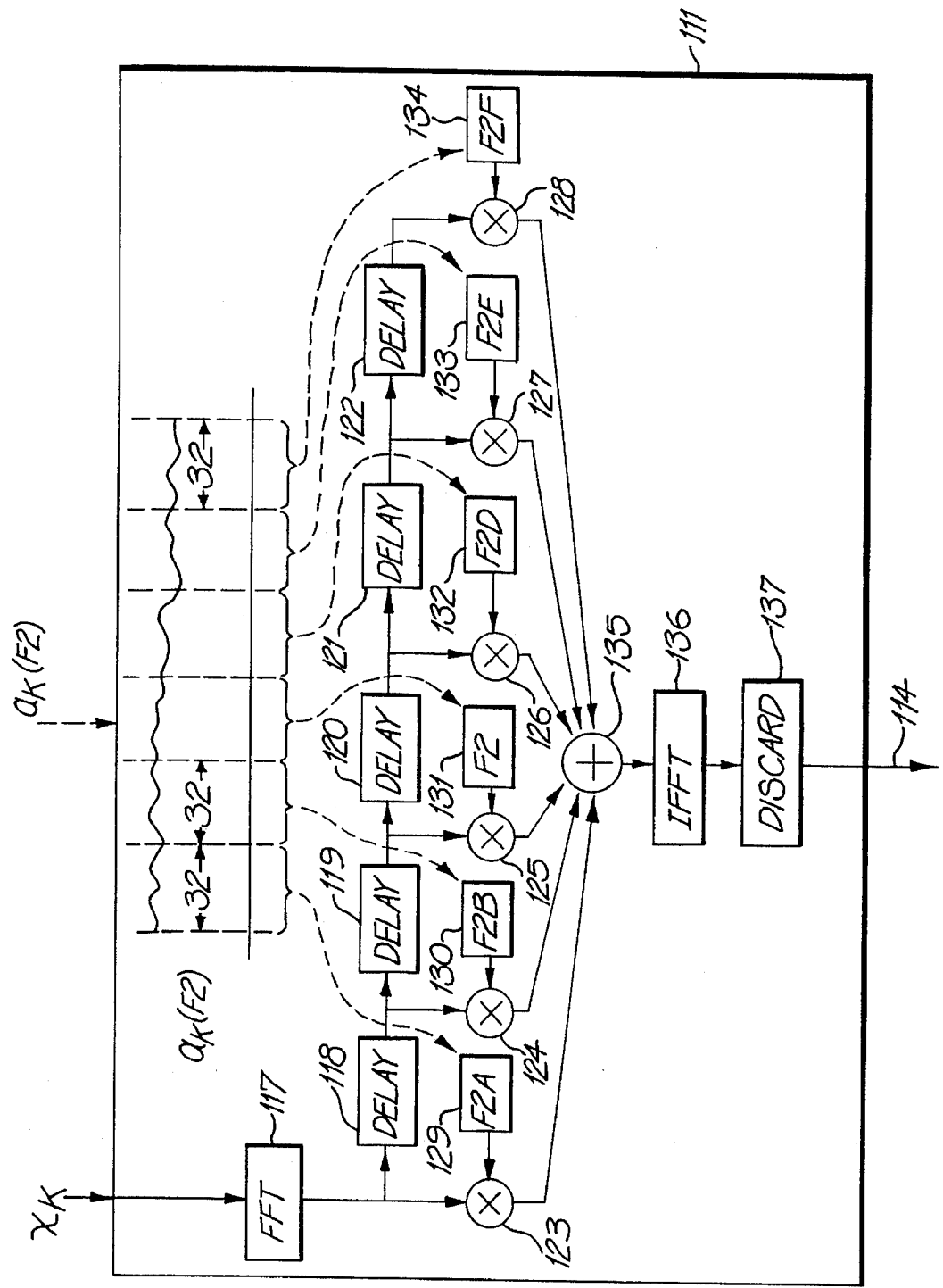

FIGS. 11A and 11B show an implementation of the low-latency filter 138 of FIG. 10 wherein there are three filter modules 110–112.

The input sequence $x_k$ is provided to time domain filter 110 and to improved fast convolution filters 111 and 112 shown in FIG. 11A. The outputs 113–115 of the filters 110–112, respectively, are coupled to a summation block 116 which produces the output sequence $y_k$. In this embodiment, the time domain filter has an impulse response length 1 that is equal to 64 and a delay equal to zero (0). The improved fast convolution filter 111 has a length 1 equal to 192 and a delay equal to 64. Similarly, the improved fast convolution filter 112 has a length 1 equal to 768 and a delay equal to 256.

FIG. 11A also graphically illustrates the desired impulse response $a_k(f)$ for the low latency filter 138. The overall length of $a_k(f)$ is 1024 and is apportioned into three subregions $a_k(F1)$, $a_k(F2)$ and $a_k(F3)$. The corresponding impulse responses of the filters 110–112 are the three subregions $a_k(F1)$, $a_k(F2)$ and $a_k(F3)$, which are indicated by dashed lines having lengths of 64, 192, and 768, respectively.

The improved fast convolution filters 111 is shown in detail in FIG. 11B. The impulse response $a_k(F2)$ also comprises six further subdivisions, each having a length of 32. The six subdivisions of $a_k(F2)$ are the corresponding impulse responses of filter blocks 129–134 (i.e. filters F2A–F2F) as indicated by the dashed arrows.

The input sequence $x_k$ is coupled to an FFT block 117 which produces the frequency domain input data. The output of the FFT block 117 is coupled to delay block 118 and to a multiplier 123. Delay blocks 118–122 are coupled in series to each other. The outputs of the delay blocks 118–122 are coupled to multipliers 124–128, respectively. Filter blocks 129–134 are coupled to the multipliers 123–128. The frequency domain output data produced by the multipliers 123–128 are summed by summation block 135. The output of the summation block 135 is provided to an IFFT block 136 which, in turn, is coupled to a discard block 137. The discard block 137 produces the output 114 of the improved fast convolution filters 111. The FFT block 117 and the IFFT block 136 are 64-point implementations.

The improved fast convolution filters 112 shown in FIG. 11A is implemented in the same manner as the filter 111 shown in FIG. 11B, but its FFT block and IFFT block are each 256 point implementation. Also, as indicated in FIG. 11A, the impulse response $a_k(F3)$ of the filter 112 also comprises six subdivisions, each having a length of 128.

The first module 110 is a low-latency (d=0) time domain filter whilst filters 111 and 112 are implemented according to the embodiment described in respect of FIGS. 8 and 9.

2. A low-latency FIR filter

As previously described, FIG. 10 shows an architecture for implementing an FIR filter by adding together N filters 105–108. If each filter is characterised as: Filter $F_i$, latency $d_i$, length $1_i$, then generally the N filters are chosen so that their latencies are ordered in ascending order, and furthermore $d_{i+1}=d_i+1_i$. This means that the first non-zero value in the impulse response of filter $F_{i+1}$, comes immediately following the last non-zero value in the impulse response of filter $F_i$. Hence this summation (indicated by block 109) of filters results in a single, longer filter with its impulse response being the sum of the impulse responses of the N component filters 105–108.

The important property of this filter is the length/latency efficiency, K, which is higher than any of the component filter efficiencies.

Figure 12:
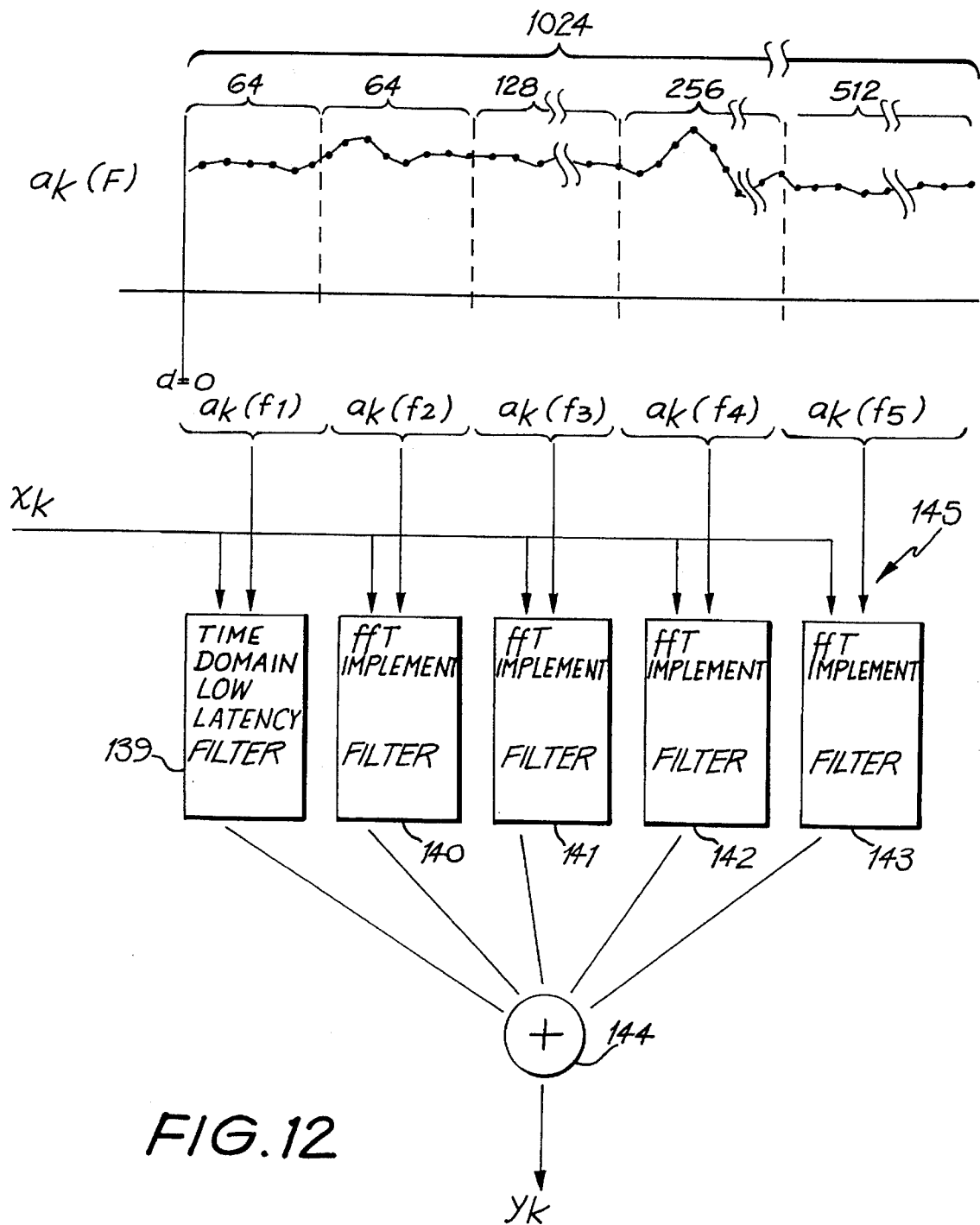
FIG. 12 illustrates the manner of processing of an input signal by an example of the filter arrangement of FIG. 10 which utilised five filter portions.

That is, the filter of FIGS. 10 and 12 uses the technique of adding together several filters to form a new filter which is as long as the sum of the component filter lengths, and whose latency is as short as the latency of the lowest-latency component filter.

Particularly, the composite filter assembly of FIG. 12 utilises the technique of combining a first time-domain (low latency) filter with additional fast-convolution (longer latency) filters to maximise filter length while minimising latency. This technique is implemented by adding together N filters, $F_1, F_2, \ldots F_N$, where filter $F_1$ is a filter with very low latency, implemented with time-domain techniques, and the other filters, $F_i$, are each implemented with fast convolution techniques. More specifically, the assembly adopts the technique whereby the N−1 fast-convolution filters, $F_i$, are composed of a sequence of filters, each with 5 longer filter length than its predecessor, and hence each with longer latency, but still preserving the property that $d_{i+1}=d_i+1_i$. This ensures that the filter, F, which is made by summing together the N component filters, has an impulse response without any "holes" in it.

With particular reference to FIG. 12 the composite filter 145 (F) comprises five filter portions 139–143 (F1–F5). The impulse response $a_k$ of the composite filter 145 is illustrated at the top of FIG. 12 and has a total sample length of 1024 samples. In this embodiment, the impulse response $a_k(f)$ is apportioned into five subdivisions $a_k(f1)$–$a_k(f5)$. The impulse responses $a_k(f1)$–$a_k(f5)$ are 64, 64, 128, 256, and 512-points long, and are the impulse responses of filters 139–143, respectively.

The input sequence $x_k$ is provided to a time domain, low latency filter 139 and to FFT-implementation, improved fast convolution filters 140–143. The outputs of filters 139–143 are provided to a summation block 144 which produces the output sequence $y_k$.

Filter 139 (F1) has an impulse response comprising the first 64 samples of the impulse response $a_k$. That is, the filter has a length of 64 samples. The filter 139 as implemented has a low latency filter (such as is referenced in Motorola document APR 7/D in respect of the DSP 56000 series of Integrated Circuits). This filter 139 has an effective latency of 0.

The subsequent filters 140–143 (F2–F5) are implemented using fast convolution digital techniques. The filters 140–143 have lengths, l, of 64, 128, 256, and 512 and latencies, d, of 64, 128, 256, and 512, respectively.

Figure 15:
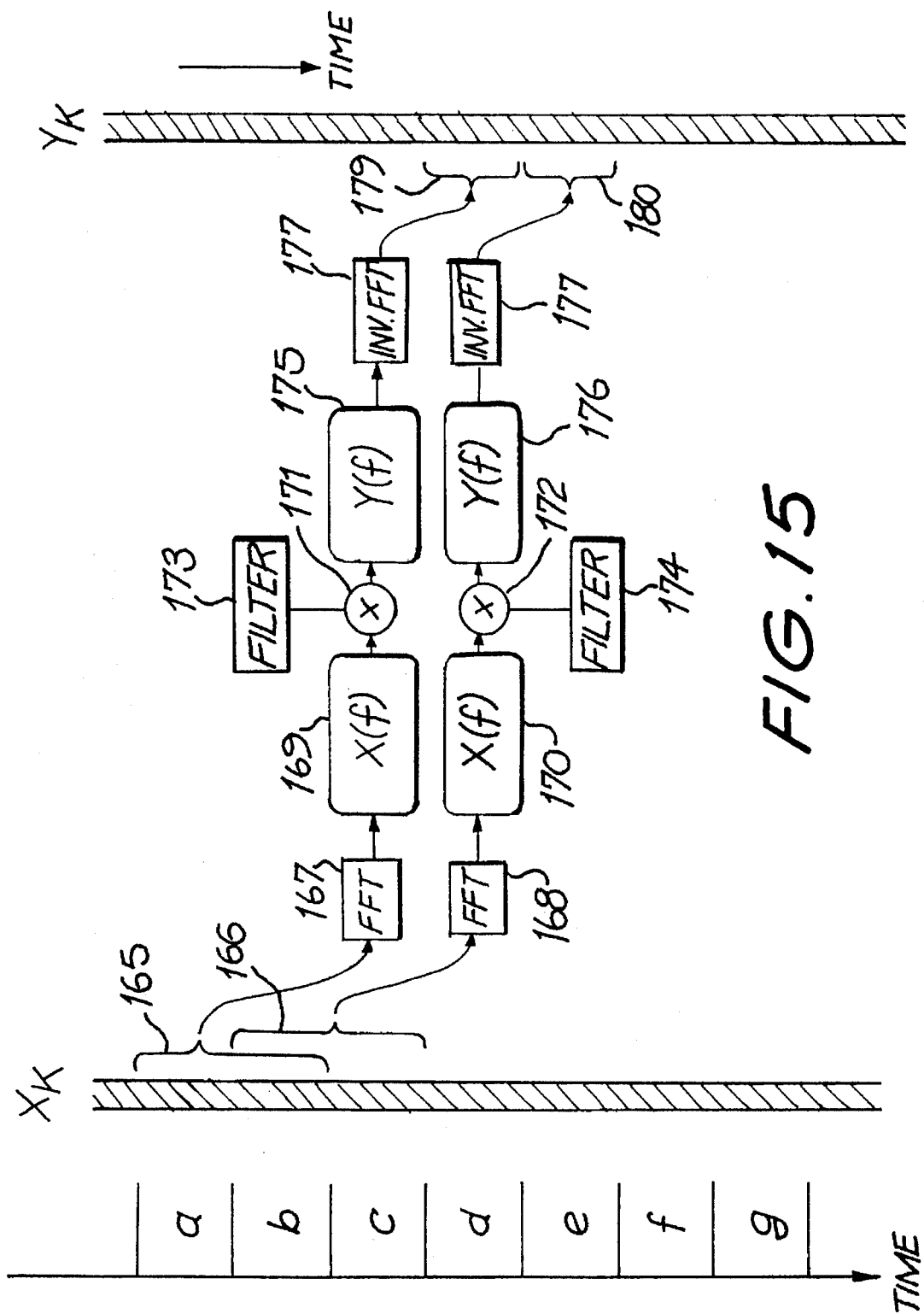
FIG. 15 illustrates a typical flow of a (prior art) fast convolution algorithm implementation suitable for filters F2–F5 of FIG. 12.

FIG. 15 illustrates the basic algorithm for such techniques. The input data $x_k$ is processed in blocks 165 and 166 using two parallel paths. For example, the input data block 165 includes the time segments a and b, and the input data block 166 comprises the time segments b and c. Each of the time segment a-g contains M samples.

The input data blocks 165 and 166 are provided to Fast Fourier Transform (FFT) blocks 167 and 168 which produces frequency domain input data (X(f)) 169 and 170, respectively. The frequency domain input data 169 and 170 are provided to multipliers 171 and 172, respectively. In addition, filter vectors 173 and 174 are also provided to the multipliers 171 and 172, respectively. The output of the multipliers 171 and 172 provide the frequency domain output data 175 and 176 to IFFT blocks 177 and 178, respectively. The IFFT blocks 177 and 178 perform an inverse FFT operation to produce output data $(y_k)$ blocks 179 and 180, respectively.

Thus, the technique performs a fast Fourier transform on the incoming sampled data, multiplies the transformed data samples by the impulse response of the filter, converts the fast Fourier transformed data samples back to the time domain by use of an inverse fast Fourier transform and then outputs the data. An overlap/discard method is used whereby only a portion of the output data is utilised.

Figure 13:
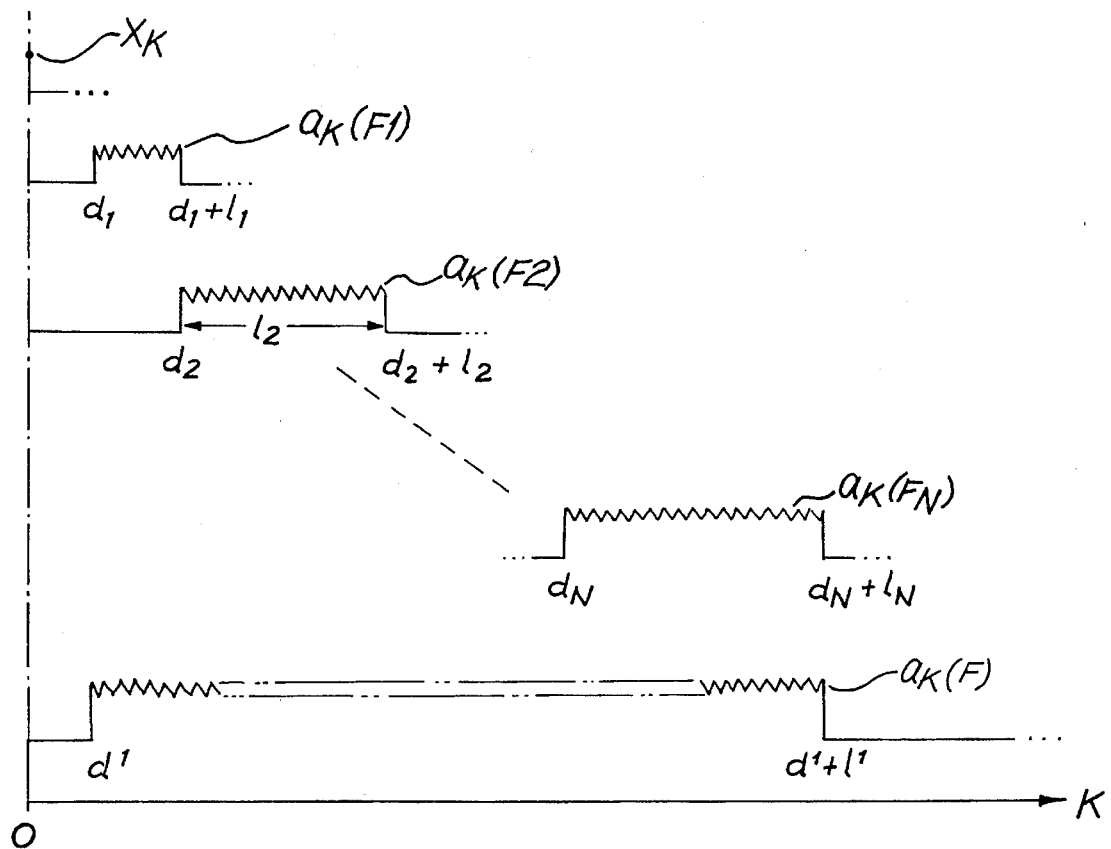
FIG. 13 illustrates the manner of selection of the filter characteristics of the filter of FIG. 12.

The length and latency of the additional filters F2, 5 F3, F4, F5 is selected according to the rule illustrated diagrammatically in FIG. 13, whereby each filter portion has a latency equal to the sum of the length and the latency of the immediately preceding filter portion.

For an impulse provided at k=0 for the input sequence $x_k$, the corresponding portions $a_k(F1)$–$a_k(FN)$ of the overall impulse $a_k(f)$ (or simply stated A) are illustrated. That is, as described below, a composite filter F' is made by summing together the outputs $F_1, F_2, \ldots, F_N$. Thus, $a_k(F1), a_k(F2), \ldots, a_k(FN)$ shown in FIG. 13 are the impulse responses of filters $F_1, F_2, \ldots, F_N$ to the impulse $x_k$. As indicated, filters $F_1, F_2, \ldots, F_N$ have latencies $d_1, d_2, \ldots, d_N$ and lengths $l_1, l_2, \ldots, l_N$, respectively.

Each of the filters $F_i$ defines outputs $y_{i,k}$. The output of filter $F_i$ at time sample k is:

$$y_{i,k} = \sum_{n=d_i}^{d_i+l_i-1} a_{i,n} x_{k-n}. \quad (4)$$

The corresponding outputs of each filter $F_1, F_2, \ldots, F_N$ are shown in FIG. 13 for an impulse $x_k$. Thus, if $$y_k' = \sum_{n=1}^{N} y_{i,k},$$

then the following expression for the overall output of the filter F' is obtained:

$$y_k' = \sum_{n=d'}^{d'+l'-1} A_n x_{k-n}. \quad (5)$$

In this case the end result is a filter having a total length of 1024 samples and a latency of 0.

Figure 14:
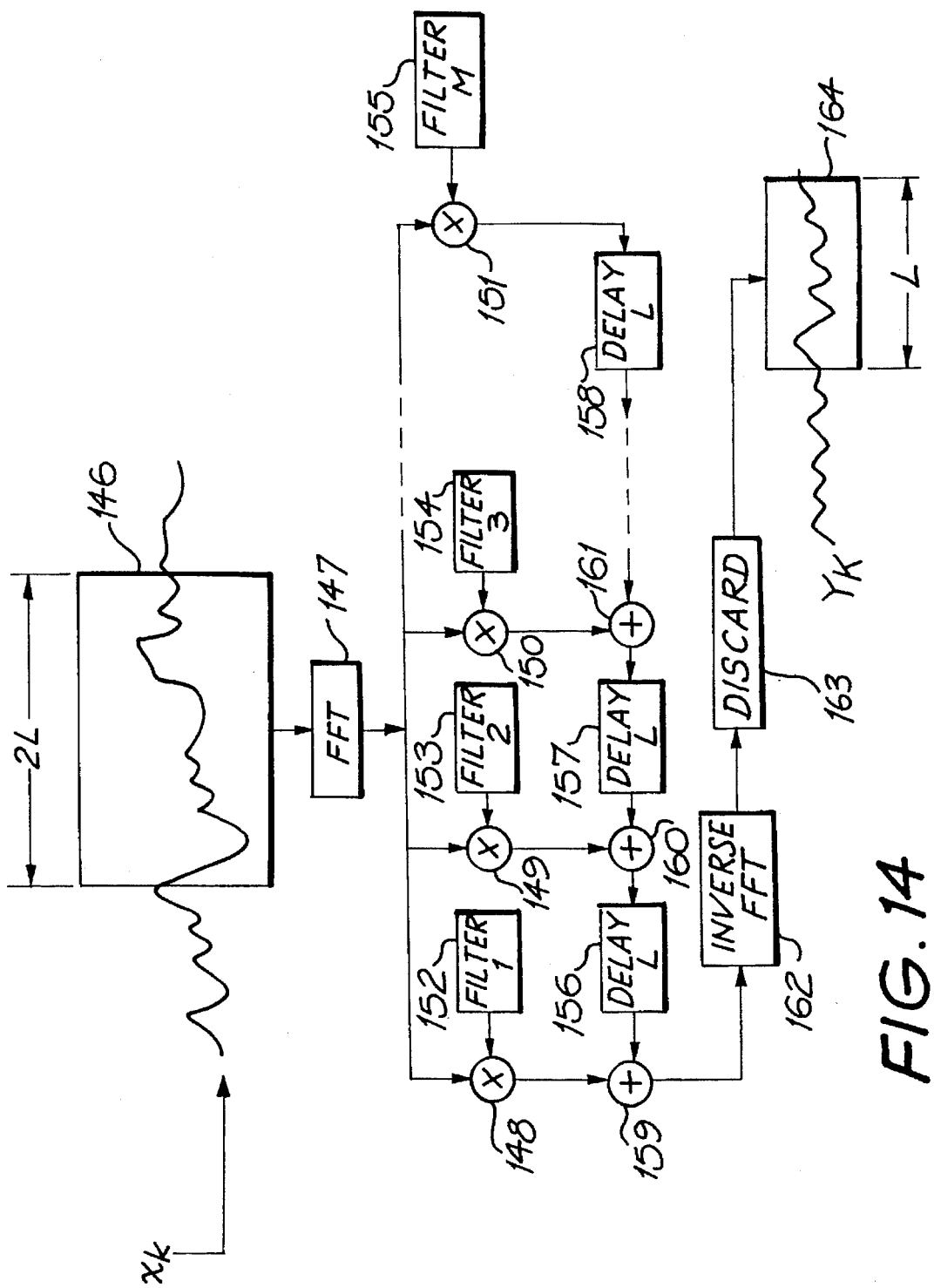
FIG. 14 is a block diagram of an alternative implementation of the summed filter of FIG. 8.

FIG. 14 illustrates a variation of the filter of FIG. 8 wherein delay is introduced after the filter algorithm is applied in the frequency domain. A block 146 of 2 L samples of the input sequence $x_k$ is provided to a single FFT block 147, which is in turn coupled to multipliers 148–151. The outputs of filter vectors (filters 1–M) 152–155 are also coupled to multipliers 148–151, respectively. The output of multipliers 148–151 are provided to summation blocks 159–161 and a delay block 158, respectively. The outputs of delay blocks 156–158 are coupled to the summation blocks 159–161, respectively. The outputs of summation blocks 159–161 are coupled to IFFT block 162 and delay blocks 156 and 157, respectively. The time domain output data generated by the IFFT block 162 is provided to discard block 163 which discards L samples of the output data to produce a block 164 comprising L samples of the output sequence $y_k$.

3. Optimized Real String Handling

Figure 16:
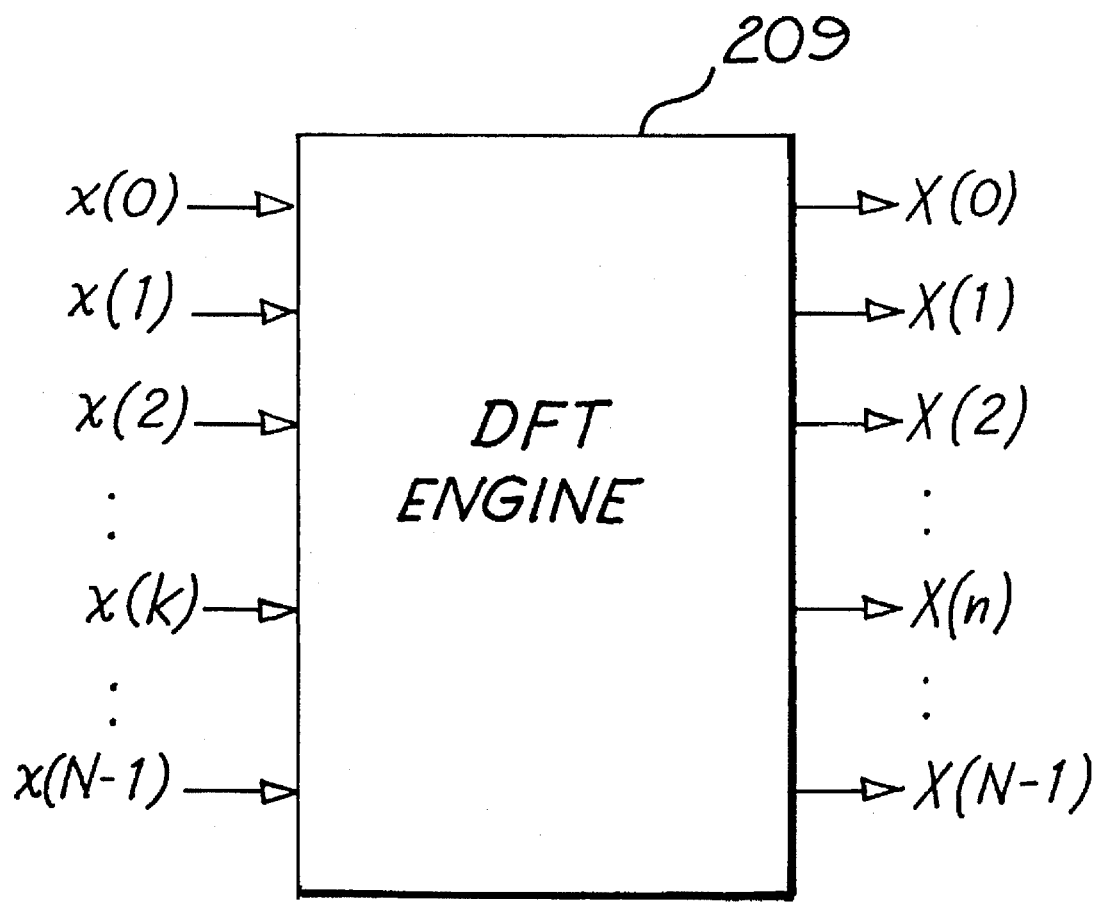
FIG. 16 illustrates a DFT engine which forms the basis for an explanation of a fourier transform algorithm optimised to process real number strings.

With reference to FIG. 16, a common method of frequency analysis is via the Discrete Fourier Transform (hereafter referred to as the DFT), which can be implemented efficiently in electronic apparatus using the Fast Fourier Transform algorithm (hereafter referred to as the FFT). A DFT engine 209 receives time-domain, input sequence values x(0)–x(N–1), and produces corresponding frequency-domain, input values X(0)–X(N–1).

The DFT is formulated to operate efficiently when its input data and output data are both complex (having a real and imaginary component). When the data input to the DFT is real, the output data from the operation will contain some redundancy, indicating that some of the processing that led to this output data was unnecessary.

In this embodiment what is described is a new transform for operating on real numbers in the digital environment, that has many of the same applications as the DFT, but without the inefficiencies of the DFT for operation on real numbers. For the purposes of this document, the algorithm described herein will be named the Modified Discrete Fourier Transform (MDFT).

The DFT is computed according to the equation below:

$$X(n) = \sum_{k=0}^{N-1} x(k) e^{\frac{-2\pi j n k}{N}}. \quad (6)$$

If the input data x(k) is real (ie. it has no imaginary component), the output data X(n) has the following properties:

$$X(0) \in \Re \quad (7)$$
$$X\left(\frac{N}{2}\right) \in \Re$$
$$X(n) = [X(N-n)]^* \text{ for } 0 < n < N/2,$$

where the * operator is used to signify complex conjugation. This means that the imaginary part of X(0), the imaginary part of X(N/2) and all {X(n): N/2<n<N} are redundant. The process of extracting only the necessary information out of the DFT output is therefore not trivial. An alternative transform is shown below:

$$Y(n) = \sum_{k=0}^{N-1} x(k) e^{\frac{-2\pi jk(n+1/2)}{N}}.$$

This is like a standard DFT except that the output vector Y(n) represents the signal's frequency components at different frequencies to the DFT. The output vector Y(n) has redundancies (just as the DFT output X(n) has), except that the redundant part of the data is more clearly extracted from Y(n) than from X(n). The redundancy in Y(n) that results when x(k) is real can be expressed as follows:

$$Y(n)=[Y(N-1-n)]^*. \tag{9}$$

This implies that the second half of this vector Y(n) is simply the complex conjugate of the first half, so that only the first half of the output vector is required to contain all of the information, when x(k) is real.

An alternative view of the above equation is that all of the odd elements of the vector are simply the complex conjugate of the even elements:

$$Y(1) = [Y(N-2)]^* \tag{10}$$
$$Y(3) = [Y(N-4)]^*$$
$$\cdot$$
$$\cdot$$
$$\cdot$$
$$Y(N-3) = [Y(2)]^*$$
$$Y(N-1) = [Y(0)]^*.$$

This means that we only need to compute the even elements of Y(n) to obtain all of the required information from the modified DFT of the real signal x(k). We can name the array Z(p) the array that contains the even elements from Y(n), as follows:

$$Z(p)=Y(2p) \text{ for } 0<p<N/2. \tag{11}$$

Based on our previous equation for Y(n), we get:

$$Z(p) = Y(2p) = \sum_{k=0}^{N-1} x(k) e^{\frac{-2\pi jk(2p+1/2)}{N}}, \tag{12}$$

which after some manipulation becomes:

$$Z(p) = \sum_{k=0}^{\frac{N}{2}-1} \left[ x(k) - jx\left(k+\frac{N}{2}\right) \right] e^{\frac{-\pi jk}{N}} e^{\frac{-2\pi jpk}{(N/2)}}. \tag{13}$$

If we create an N/2 length complex vector from the N length real vector:

$$x'(1) = \left[ x(1) - jx\left(1+\frac{N}{2}\right) \right] e^{\frac{-\pi jl}{N}}, \text{ for } 0 \leq 1 < N/2, \tag{14}$$

then we can see that:

$$Z(p)=DFT_{(N/2)}[x'(1)]. \tag{15}$$

This means that we have computed the vector Z(p) by using a DFT of length N/2.

We say that Z(p)=MDFT[x(k)] (where MDFT indicates the Modified Discrete Fourier Transform operator). The procedure to follow for computing Z(p) is then as follows:

1. Take the input vector x(k) of length N, where each element of-x(k) is real.
2. Create the vector x'(1), a complex vector of length N/2 by the method of equation (14) above.
3. Compute the N/2 point DFT of x'(1) to give the N/2 complex result vector Z(p).

The MDFT has many properties that make it useful in similar applications to the DFT. Firstly, it can be used to perform linear convolution in the same way as the DFT.

Secondly, it has an inverse transform that looks very similar to the forward transform:

$$x'(k)=IDFT_{(N/2)}[Z(p)], \tag{16}$$

where IDFT indicates the N/2 point Inverse Discrete Fourier Transform.

The algorithm can be implemented in an electronic apparatus supplied with a set of N real numbers and producing N/2 complex output numbers, representing the MDFT of the input data. This apparatus uses digital arithmetic elements to perform each of the arithmetic operations as described in the preceding text.

Another embodiment of the present invention is a pair of apparatus, the first of which computes an MDFT as described in the previous paragraph, and the second of which computes an inverse MDFT, using the arithmetic procedures described previously in this document. By passing overlapped blocks of data from a continuous stream of input data through the MDFT computer, then multiplying the Z(p) coefficients by appropriate filter coefficients, then passing the resulting data through the Inverse MDFT computer and recombining segments of output data appropriately, a modified Fast Convolution processor can be built.

The above describes a modification to the DFT that makes it more useful in a number of applications particularly but not limited to the real time filter applications previously described. All of these extensions to the DFT can also be applied to the FFT algorithm and other fast implementations of the DFT.

Example 1

Figure 17A:
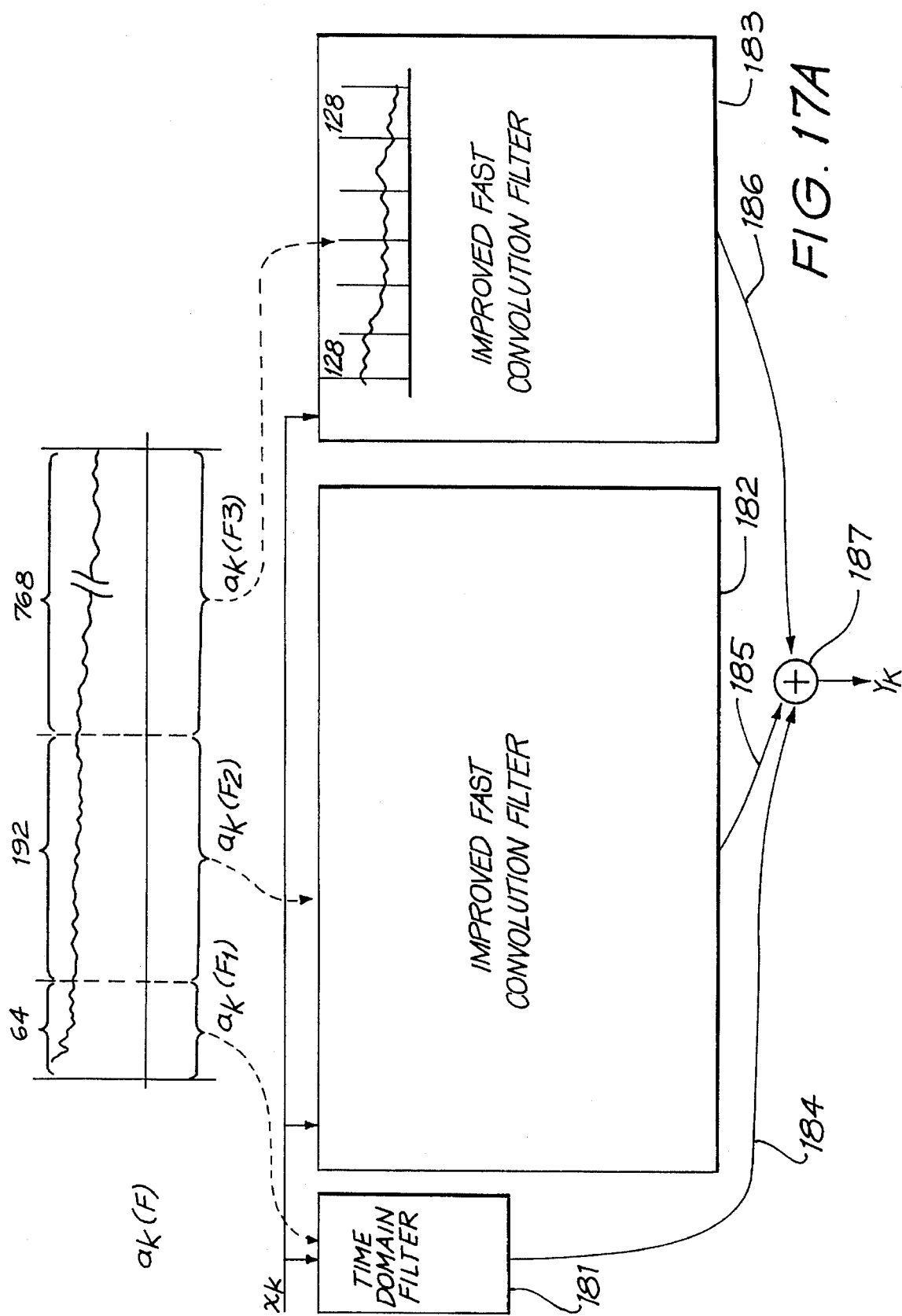
FIGS. 17A&17B are block diagrams of a further embodiment of the invention wherein the summed filter of FIG. 10 is implemented utilizing a Modified Discrete Fourier Transform.
Figure 17B:
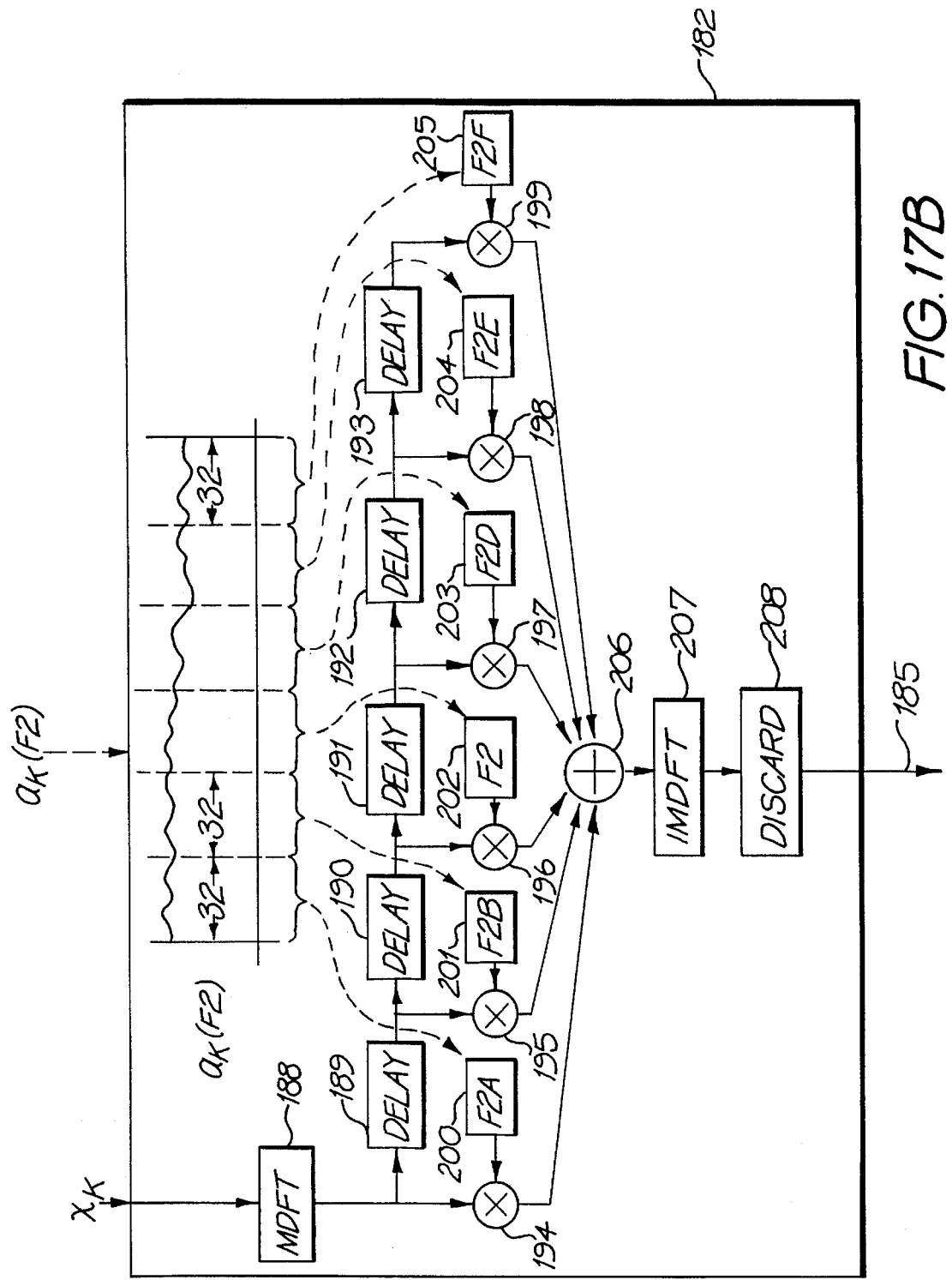

FIGS. 17A and 17B illustrate an implementation of the summed filter of FIGS. 11A and 11B wherein the Modified Discrete Fourier Transform (MDFT) described immediately above is applied for the purposes of transforming the data stream into the frequency domain and the corresponding Inverse Modified Discrete Fourier Transform (IMDFT) is applied-following application of the filter algorithm and prior to discard for conversion from the frequency domain.

The input sequence $x_k$ is provided to time domain filter 181 and to improved fast convolution filters 182 and 183 shown in FIG. 17A. The outputs 184–186 of the filters 181–183, respectively, are coupled to a summation block 187 which produces the output sequence $y_k$. In this embodiment, the time domain filter has an impulse response length 1 that is equal to 64 and a delay equal to zero (0). The improved fast convolution filter 182 has a length 1 equal to 192 and a latency equal to 64. Similarly, the improved fast convolution filter 183 has a length 1 equal to 768 and a latency equal to 256.

The overall length of $a_k(f)$ is 1024 and is apportioned into three subregions $a_k(F1)$, $a_k(F2)$ and $a_k(F3)$. The corresponding impulse responses of the filters 181–183 are the three subregions $a_k(F1)$, $a_k(F2)$ and $a_k(F3)$, which are indicated by dashed lines having lengths of 64, 192, and 768, respectively.

The improved fast convolution filters 182 is shown in detail in FIG. 17B. The impulse response $a_k(F2)$ also comprises six further subdivisions, each having a length of 32, that are the corresponding impulse responses of filter blocks 200–205.

The input sequence $x_k$ is coupled to a modified FFT (MDFT) block 188, and the output of the MDFT block 188 is coupled to delay block 189 and to a multiplier 194. Delay blocks 189–193 are coupled in series to each other. The outputs of the delay blocks 189–193 are coupled to multipliers 195–199, respectively. Filter blocks 200–205 are coupled to the multipliers 194–199. The outputs of multipliers 194–199 are summed by summation block 206. The output of the summation block 206 is provided to an inverse MDFT block 207 which, in turn, is coupled to a discard block 208. The discard block 137 produces the output 185 of the improved fast convolution filters 182.

In filter 182 of FIGS. 17A and 17B, the MDFT block 188 takes 64 real words of input and produces 32 complex words of output. The IMDFT block 207 takes 32 complex words of input and produces 64 real words of output.

In filter 183 of FIG. 17A, the MDFT block (not shown) takes 256 real words of input and produces 128 complex words of output. The IMDFT block (not shown) takes 128 complex words of input and produces 256 real words of output. The filter of FIGS. 17A and 17B is implemented using a Motorola DSP 56001 processor incorporating software (bootable from ROM or from another host computer) to implement the algorithm. The delay elements are implemented using a bank of external memory chips comprising three MCM 6206 memory chips.

Data input and output between the analog and digital domains is effected by an ADC and DAC chip, the Crystal CS 4216, communicating via the synchronous serial communication port of the DSP 56001.

The above describes only some embodiments of the present invention and modifications obvious to those skilled in the art can be made thereto without departing from the scope and spirit of the present invention.

I claim:

1. A method for building a digital filter with a long impulse response and low latency, built by operating a number of smaller component filters in parallel and combining their outputs by addition, with each component filter operating with a different delay such that the net operation of the ensemble of said component filters is the same as a single filter with a longer impulse response, and the latency of the ensemble is equal to the shortest latency of said component filters wherein one or more of said component filters is implemented as a time-domain finite impulse response filter, built with multiply and add operations, and the remainder of said component filters are implemented using a fast convolution method, such that time-domain filter(s) provides the lowest latency portion of the ensemble impulse, and fast convolution filter(s) provide longer filter components, wherein said fast convolution filters are built using the Discrete Fourier Transform or the Fast Fourier Transform.

2. A method for building a digital filter with a long impulse response and low latency built by operating a number of smaller component filters in parallel and combining their outputs by addition, with each component filter operating with a different delay such that the net operation of the ensemble of said component filters is the same as a single filter with a longer impulse response, and the latency of the ensemble is equal to the shortest latency of said component filters wherein one or more of said component filters is implemented as a time-domain finite impulse response filter, built with multiply and add operations, and the remainder of said component filters are implemented using a fast convolution method, such that time-domain filter provides the lowest latency portion of the ensemble impulse, and fast-convolution filter provide the longer filter components, wherein said fast-convolution filters are built using a Modified Discrete Fourier Transform method comprising the steps of:

receiving an input vector x(k) of length N, where each element of x(k) is real;

means for creating a complex vector x'(l) of length N/2 according to the following:

$$x'(l) = \left[ x(l) - jx\left(l + \frac{N}{2}\right) \right] e^{\frac{-\pi j l}{N}} \text{ for } 0 \leq l < \frac{N}{2} \text{; and}$$

computing an N/2 point Discrete Fourier Transform (DFT) of x'(l) to give the N/2 complex result vector Z(p):

$$Z(p) = DFT_{(\frac{N}{2})}[x'(l)],$$

and a complementary Inverse Modified Discrete Fourier Transform method.

3. A composite electrical filter comprising a plurality of filter modules arranged to receive in parallel an incoming input signal for filtering, an output from each of said filter modules being summed to produce a composite filtered output signal, each of said filter modules having an impulse response that is a selected portion of said impulse response of the composite filter wherein the number of said filter module is N, comprising filters $F_1, F_2 \ldots F_N$ and wherein filter modules $F_1$ is a filter with a very low latency implemented with time domain techniques while all other filter modules $F_i$ are implemented with fast convolution means and these fast convolution filters $F_i$ are composed of a sequence of filters, each with longer filter length than its predecessor and hence each with longer latency, but still preserving the property that $d_{i+1}=d_i+l_i$ whereby it is ensured that said composite filter F output formed by summing together N component filter outputs has an impulse response without any "holes" in it.

4. A digital filter having an impulse response that includes a low latency and a long filter length, said digital filter comprising a plurality of component filters each having an impulse response including a latency and a filter length, each of said component filter having an input connected to an input of said digital filter, and an output connected to a summing means for combining, by addition, each of said outputs to form an output of said digital filter such that the impulse response of said digital filter is the sum of the component impulse responses and the low latency is equal to the shortest one of the component latencies.

5. The digital filter as claimed in claim 4, wherein at least a first one of said component filters is specifically configured to provide said low latency, and at least another one of said component filters is specifically configured to provide a long filter length.

6. The digital filter as claimed in claim 5 wherein, excepting said first component filter, a first non-zero impulse component of each remaining component filter occurs during or immediately following the impulse response of another one of said component filters.

7. The digital filter as claimed in claim 6 wherein at least one of said component filters comprises a fast convolution filter having a transform element, a filter element, and an inverse transform element connected in cascade.

8. The digital filter as claimed in claim 7 comprising a first fast convolution filter configured to provide said low latency and at least one other fast convolution filter configured to provide said long filter length.

9. The digital filter as claimed in claim 7 wherein at least one of said component filters is implemented as a time-domain finite impulse response filter including multiply and add operations and the remainder of said component filters, of which there is at least one, are each implemented using a fast convolution filter such that the time domain filter provides said low latency and said fast convolution filter substantially provide said long filter length.

10. The digital filter as claimed in claim 7 wherein at least one of said fast convolution filter comprises a modified convolution filter in which said filter element comprises a plurality of filter sub-elements arranged in parallel and each configured to receive a transformed signal output from said transform element, each of said filter sub-elements supplying a corresponding input of an adding element that outputs to said inverse transform element.

11. The digital filter as claimed in claim 10 wherein each of said filter sub-element comprises a delay unit that delays application of said transformed signal to a corresponding multiplication unit where said delayed transformed signal is multiplied by filter coefficients preselected to form at least a part of said impulse response, each of said multiplication units outputting to said adding element.

12. The digital filter as claimed in claim 11 wherein said delay units delay said transformed signal by an integer multiple of a predetermined delay period prior to applying same to the corresponding multiplication unit.

13. The digital filter as claimed in claim 12 wherein said filter element comprises N−1 (N being an integer and $\leq 2$) of said delay units connected in cascade and each of said predetermined delay, a first one of said delay units being input with said transformed signal and N of said multiplication units, a first one of which being input with said transformed signal and the remainder being input with the output of a corresponding one of said delay units.

14. The digital filter as claimed in claim 10, comprising two or more of said component filters, each of which are formed as said modified convolution filter.

15. The digital filter as claimed in claim 10 wherein at least one of said component filters is a time-domain filter configured to provide low latency.

16. The digital filter as claimed in claim 15 wherein said time domain filter comprises zero latency.

17. The digital filter as claimed in claim 16 comprising said zero latency time domain filter, one or more modified convolution filters and one or more fast convolution filters.

18. The digital filter as claimed in claim 15 wherein said time domain filter is a finite impulse response filter.

19. The digital filter as claimed in claim 7 wherein said fast-convolution filter(s) perform one of a Discrete Fourier Transform or a Fast Fourier Transform.

20. The digital filter as claimed in claim 7 wherein the fast-convolution filters are built using a Modified Discrete Fourier Transform method comprising the steps of:

receiving an input vector x(k) of length N, where each element of x(k) is real;

creating a complex vector x'(l) of length N/2 according to the following:

$$x'(l) = \left[ x(l) - jx\left(l + \frac{N}{2}\right) \right] e^{\frac{-\pi j l}{N}} \text{ for } 0 \leq l < \frac{N}{2} \text{ ; and}$$

computing an N/2 point Discrete Fourier Transform (DFT) of x'(l) to give the N/2 complex result vector Z(p):

$$Z(p) = DFT_{(\frac{N}{2})}[x'(l)],$$

and a complementary Inverse Modified Discrete Fourier Transform.

21. The digital filter as claimed in claim 4 wherein said low latency is sufficiently short so as to permit said digital filter to be used to process live audio signals.

22. A digital filter comprising a plurality of filter modules arranged in parallel and each configured to receive an input signal for filtering, an output of each of said filter modules being summed to produce a composite filtered output signal, each of said filter modules having a corresponding filter length and a corresponding impulse response that is a selected portion of a desired impulse response of said digital filter, wherein the length of each of said filter modules is different, and wherein at least the shortest length filter module is a time-domain low latency filter configured to process at least first portions of said desired impulse response and the longer length filter module is a fast-convolution longer latency filter configured to process subsequent portions of said desired impulse response.

23. The digital filter of claim 22, where the number of said filter modules is N comprising filters $F_1, F_2 \ldots F_N$ and wherein filter modules $F_1$ is a filter with a very low latency implemented with time domain techniques while all other filter modules $F_i$ ($2 \leq i \leq N$) are implemented with fast convolution techniques, each of said filters $Fi$ being of longer filter length (l) than its predecessor and hence each with longer latency (d), but preserving the property that $d_{i+1} = d_i + l_i$, thereby ensuring that the composite filtered output formed by summing together the N component filter outputs forms a substantially continuous impulse response.

24. A Fourier transform processor adapted to transform strings of real numbers of use in digital filtering, said processor comprising:

input means for receiving an input vector x(k) of length N, where each element of x(k) is real;

vector means for creating a complex vector x'(l) of length N/2 according to the following:

$$x'(l) = \left[ x(l) - jx\left(l + \frac{N}{2}\right) \right] e^{\frac{-\pi j l}{N}} \text{ for } 0 \leq l < \frac{N}{2} \text{ ; and}$$

transform means for computing an N/2 point Discrete Fourier Transform (DFT) of x'(l) to give the N/2 complex result vector Z(p):

$$Z(p) = DFT_{(\frac{N}{2})}[x'(l)],$$

and a complementary Inverse Modified Discrete Fourier Transform.

25. A digital filter with a long impulse response and low latency comprising a smaller number of component filters in parallel and adding means for combining the output of said component filters, with each component filter operating with a different delay such that the net operation of said component filters is the same as a single filter with a longer impulse response, and the latency of said component filters is equal to a shortest latency of the said component filters wherein one or more of said component filters comprise a time-domain finite impulse response filter and multipliers and adders, and the remainder of said component filters comprise a fast convolution means, such that time-domain filter provide the lowest latency portion of said component filters impulse response, and the fast-convolution means provide the longer filter components and said fast-convolution means comprise Discrete Fourier Transformer or the Fast Fourier Transformer.

26. A digital filter with a long impulse response and low latency comprising a smaller number of component filters in parallel and adding means for combining the output of said component filters, with each component filter operating with a different delay such that the net operation of said component filters is the same as a single filter with a longer impulse response, and the latency of said component filters is equal to a shortest latency of the said component filters wherein one or more of said component filters comprise a time-domain finite impulse response filter and multipliers and adders, and the remainder of said component filters comprise a fast convolution means, such that time-domain filter provide the lowest latency portion of said component filters impulse response, and the fast-convolution means provide the longer filter components and said fast-convolution means comprise a Modified Discrete Fourier Transform processor comprising: means for receiving an input vector $x(k)$ of length N, where each element of $x(k)$ is real;

means for creating a complex vector $x'(l)$ of length N/2 according to the following:

$$x'(l)=[x(l)-jx([l+N/2)\,]e^{-\pi j l/N} \text{ for } 0\leq l\leq N/2;$$

and means for computing an N/2 point Discrete Fourier Transform (DFT) of $x'(l)$ to give the N/2 complex result vector $Z(p)$:

$$Z(p)=DFT_{(n/2)}[x'(l)],$$

and a complementary Inverse Modified Discrete Fourier Transform processor.

* * * * *